United States Patent
Lee et al.

(10) Patent No.: US 8,683,292 B2
(45) Date of Patent: *Mar. 25, 2014

(54) METHOD AND SYSTEM FOR PROVIDING LOW DENSITY PARITY CHECK (LDPC) CODING FOR SCRAMBLED CODED MULTIPLE ACCESS (SCMA)

(71) Applicant: Hughes Network Systems, LLC, Germantown, MD (US)

(72) Inventors: Lin-Nan Lee, Potomac, MD (US); Mustafa Eroz, Germantown, MD (US)

(73) Assignee: Hughes Network Systems, LLC, Germantown, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/791,949

(22) Filed: Mar. 9, 2013

(65) Prior Publication Data

US 2013/0198581 A1 Aug. 1, 2013

Related U.S. Application Data

(63) Continuation of application No. 12/686,171, filed on Jan. 12, 2010, now abandoned.

(51) Int. Cl.
*H03M 13/00* (2006.01)
*H04L 1/18* (2006.01)
*G11C 29/00* (2006.01)
*H03M 13/03* (2006.01)
*G06F 11/00* (2006.01)

(52) U.S. Cl.
USPC ........... 714/758; 714/786; 714/800; 714/801; 714/805; 714/768; 714/751; 714/763; 714/766; 714/767

(58) Field of Classification Search
None
See application file for complete search history.

(56) References Cited

U.S. PATENT DOCUMENTS

| | | | |
|---|---|---|---|
| 6,023,783 A | 2/2000 | Divsalar et al. |
| 6,430,722 B1 | 8/2002 | Eroz et al. |
| 6,529,495 B1 | 3/2003 | Aazhang et al. |
| 6,724,813 B1 | 4/2004 | Jamal et al. |
| 6,829,308 B2 | 12/2004 | Eroz et al. |
| 6,940,827 B2 | 9/2005 | Li et al. |
| 6,963,622 B2 | 11/2005 | Eroz et al. |
| 7,020,829 B2 | 3/2006 | Eroz et al. |
| 7,191,378 B2 | 3/2007 | Eroz et al. |
| 7,203,887 B2 | 4/2007 | Eroz et al. |
| 7,234,098 B2 | 6/2007 | Eroz et al. |

(Continued)

FOREIGN PATENT DOCUMENTS

| EP | 1387496 A2 | 2/2004 |
|---|---|---|
| EP | 2365639 A2 | 9/2011 |
| WO | WO 2004/006442 A1 | 1/2004 |

OTHER PUBLICATIONS

Eroz, Mustafa et al., "An Innovative Low-Density Parity-Check Code Design With Near-Shannon-Limit Performance and Simple Implementation", IEEE Transactions on Communications, vol. 54, No. 1, Jan. 1, 2006, XPOQ7902266, Jan. 1, 2006, 13-17.

(Continued)

*Primary Examiner* — Guerrier Merant
(74) *Attorney, Agent, or Firm* — Potomac Technology Law, LLC

(57) ABSTRACT

A multiple access scheme is described. One or more encoders are configured to encode a plurality of bit streams using Low Density Parity Check (LDPC) coding. The bit streams correspond to a respective plurality of terminals. The plurality of bit streams are converted to provide a multiple access scheme for the terminals.

26 Claims, 29 Drawing Sheets

(56) References Cited

U.S. PATENT DOCUMENTS

| | | | |
|---|---|---|---|
| 7,237,174 B2 | 6/2007 | Eroz et al. |
| 7,296,208 B2 | 11/2007 | Sun et al. |
| 7,334,181 B2 | 2/2008 | Eroz et al. |
| 7,376,883 B2 | 5/2008 | Eroz et al. |
| 7,398,455 B2 | 7/2008 | Eroz et al. |
| 7,424,662 B2 | 9/2008 | Eroz et al. |
| 7,430,396 B2 | 9/2008 | Sun et al. |
| 7,447,984 B2 | 11/2008 | Cameron et al. |
| 7,461,325 B2 | 12/2008 | Eroz et al. |
| 7,483,496 B2 | 1/2009 | Eroz et al. |
| 7,577,207 B2 | 8/2009 | Eroz et al. |
| 7,673,226 B2 | 3/2010 | Eroz et al. |
| 7,725,802 B2 | 5/2010 | Eroz et al. |
| 7,746,758 B2 | 6/2010 | Stolpman |
| 7,770,089 B2 | 8/2010 | Eroz et al. |
| 7,856,586 B2 | 12/2010 | Eroz et al. |
| 7,864,869 B2 | 1/2011 | Eroz et al. |
| 7,954,036 B2 | 5/2011 | Eroz et al. |
| 7,962,830 B2 | 6/2011 | Eroz et al. |
| 8,028,224 B2 | 9/2011 | Eroz et al. |
| 8,069,393 B2 | 11/2011 | Eroz et al. |
| 8,095,854 B2 | 1/2012 | Eroz et al. |
| 8,102,947 B2 | 1/2012 | Eroz et al. |
| 8,126,076 B2 | 2/2012 | Sartori et al. |
| 8,140,931 B2 | 3/2012 | Eroz et al. |
| 8,144,801 B2 | 3/2012 | Eroz et al. |
| 8,145,980 B2 | 3/2012 | Eroz et al. |
| 8,181,085 B2 | 5/2012 | Eroz et al. |
| 8,291,293 B2 | 10/2012 | Eroz et al. |
| 2003/0037298 A1 | 2/2003 | Eleftheriou et al. |
| 2004/0019845 A1 | 1/2004 | Eroz et al. |
| 2004/0054960 A1 | 3/2004 | Eroz et al. |
| 2004/0258177 A1 | 12/2004 | Shen et al. |
| 2006/0224935 A1 | 10/2006 | Cameron et al. |
| 2008/0019263 A1 | 1/2008 | Stolpman |
| 2008/0313523 A1 | 12/2008 | Sun et al. |
| 2009/0187804 A1 | 7/2009 | Shen et al. |
| 2010/0100789 A1 | 4/2010 | Yu et al. |
| 2010/0122143 A1 | 5/2010 | Lee et al. |
| 2011/0051825 A1 | 3/2011 | Tao et al. |
| 2011/0202820 A1 | 8/2011 | Eroz et al. |

OTHER PUBLICATIONS

Eroz, Mustafa et al., "Structured Low-Density Parity-Check Code Design for Next Generation Digital Video Broadcast", Military Communications Conference, 2005, Oct. 17, 2005, XP010901536, Oct. 17, 2005, 1-6.

ESR P1064EP00, , "European Search Report", EP 2365639 A3, Aug. 1, 2012.

ETSI EN 302 307 V1.2.1 (DVB), "ETSI EN 302 307 V1.2.1 Digital Video Broadcasting (DVB); Second generation framing structure, channel coding and modulation systems for Broadcasting, Interactive Services, News Gathering and other broadband satellite applications (DVB-S2)", ETSI EN 302 307 V1.2.1, Aug. 1, 2009, XP002678089, Aug. 1, 2009, 22-28, 37-49.

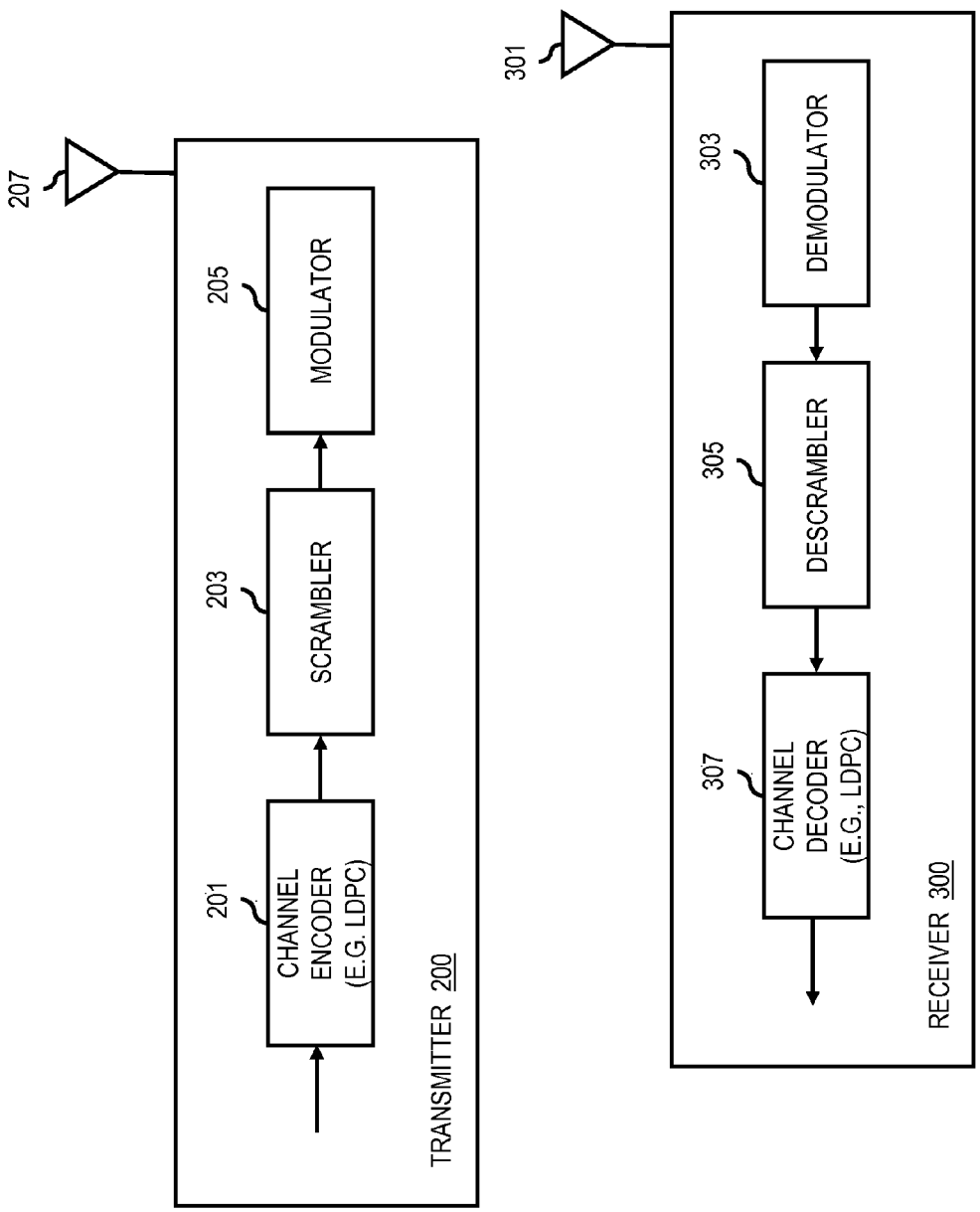

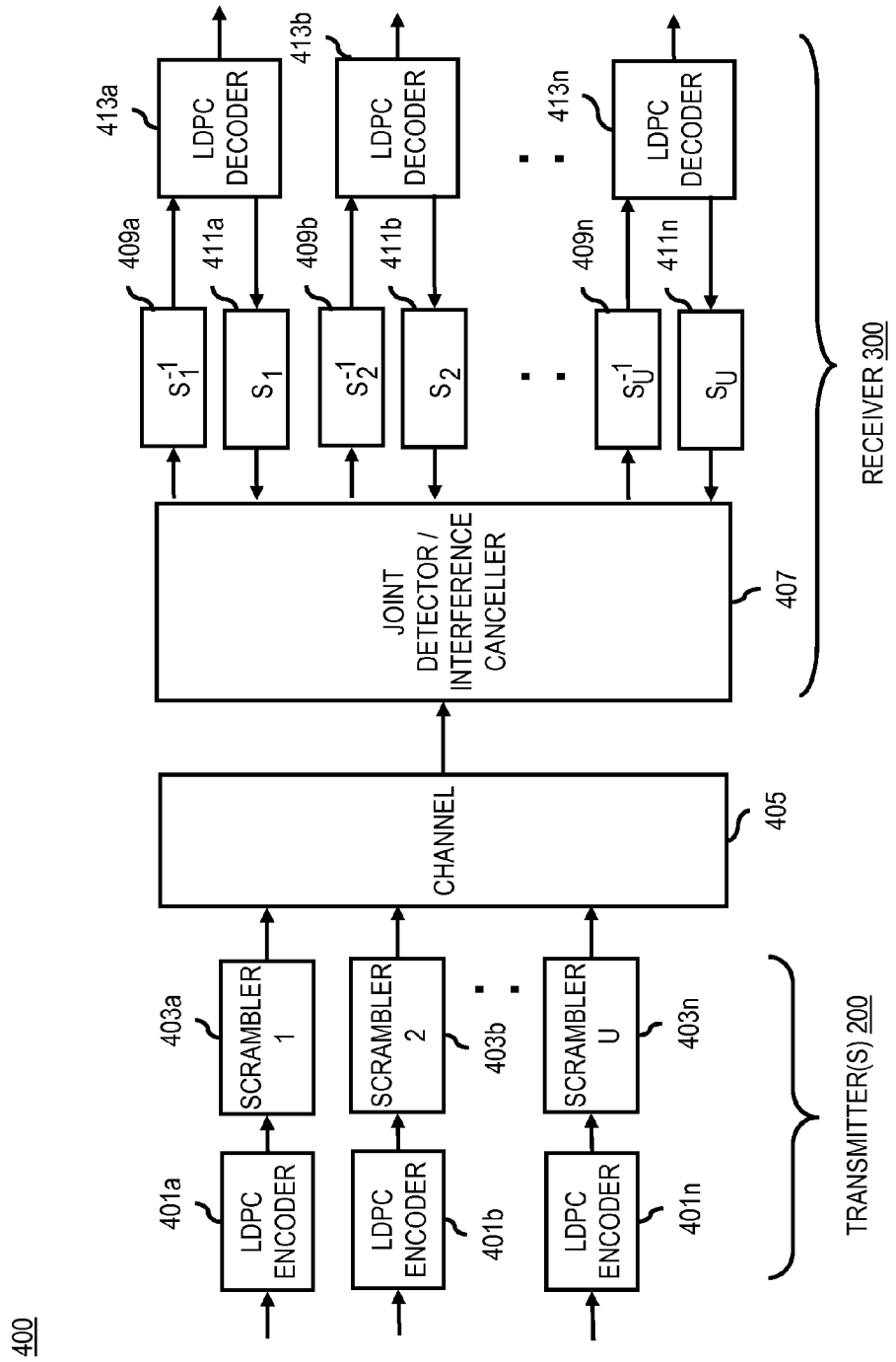

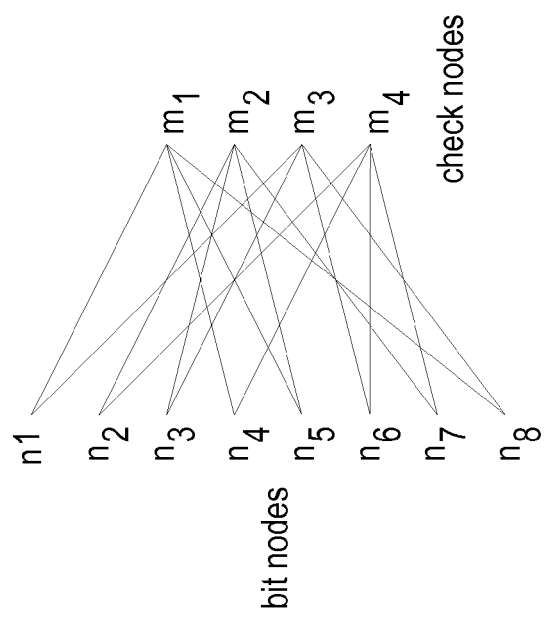

$$\begin{bmatrix} e_0 & e_1 & e_2 & e_3 & e_4 & e_5 & e_6 & e_7 & e_8 & e_9 & e_{10} & e_{11} \\ e_{12} & e_{13} & e_{14} & e_{15} & e_{16} & e_{17} & e_{18} & e_{19} & e_{20} & e_{21} & e_{22} & e_{23} \\ e_{24} & e_{25} & e_{26} & e_{27} & e_{28} & e_{29} & e_{30} & e_{31} & e_{32} & e_{33} & e_{34} & e_{35} \end{bmatrix}$$

↖ 1305

FIG. 13C $$\begin{bmatrix} x & e_{39} & e_{43} \\ e_{36} & e_{40} & e_{44} \\ e_{37} & e_{41} & e_{45} \\ e_{38} & e_{42} & e_{46} \end{bmatrix}$$

FIG. 14A $$H = \begin{bmatrix}
0 & 0 & 0 & 0 & 0 & 0 & 0 & 0 & 0 & 0 & 0 & 0 & 0 & 0 & 1 \\
0 & 0 & 0 & 0 & 0 & 0 & 0 & 0 & 0 & 0 & 0 & 0 & 0 & 1 & 1 \\
0 & 0 & 0 & 0 & 0 & 0 & 0 & 0 & 0 & 0 & 0 & 0 & 1 & 1 & 0 \\
0 & 0 & 0 & 0 & 0 & 0 & 0 & 0 & 0 & 0 & 0 & 1 & 1 & 0 & 0 \\
0 & 0 & 0 & 0 & 0 & 0 & 0 & 0 & 0 & 0 & 1 & 1 & 0 & 0 & 0 \\
0 & 0 & 0 & 0 & 0 & 0 & 0 & 0 & 0 & 1 & 1 & 0 & 0 & 0 & 0 \\
0 & 0 & 0 & 0 & 0 & 0 & 0 & 0 & 1 & 1 & 0 & 0 & 0 & 0 & 0 \\
0 & 0 & 0 & 0 & 0 & 0 & 0 & 1 & 1 & 0 & 0 & 0 & 0 & 0 & 0 \\
0 & 0 & 0 & 0 & 0 & 0 & 1 & 1 & 0 & 0 & 0 & 0 & 0 & 0 & 0 \\
0 & 0 & 0 & 0 & 0 & 1 & 1 & 0 & 0 & 0 & 0 & 0 & 0 & 0 & 0 \\
0 & 0 & 0 & 0 & 1 & 1 & 0 & 0 & 0 & 0 & 0 & 0 & 0 & 0 & 0 \\
0 & 0 & 0 & 1 & 1 & 0 & 0 & 0 & 0 & 0 & 0 & 0 & 0 & 0 & 0 \\
0 & 0 & 1 & 1 & 0 & 0 & 0 & 0 & 0 & 0 & 0 & 0 & 0 & 0 & 0 \\
0 & 1 & 1 & 0 & 0 & 0 & 0 & 0 & 0 & 0 & 0 & 0 & 0 & 0 & 0 \\
1 & 1 & 0 & 0 & 0 & 0 & 0 & 0 & 0 & 0 & 0 & 0 & 0 & 0 & 0 \\
0 & 0 & 0 & 0 & 0 & 1 & 0 & 0 & 1 & 0 & 1 & 0 & 0 & 0 & 0 \\
1 & 0 & 1 & 0 & 0 & 0 & 0 & 0 & 0 & 0 & 0 & 0 & 1 & 0 & 0
\end{bmatrix}$$

1401

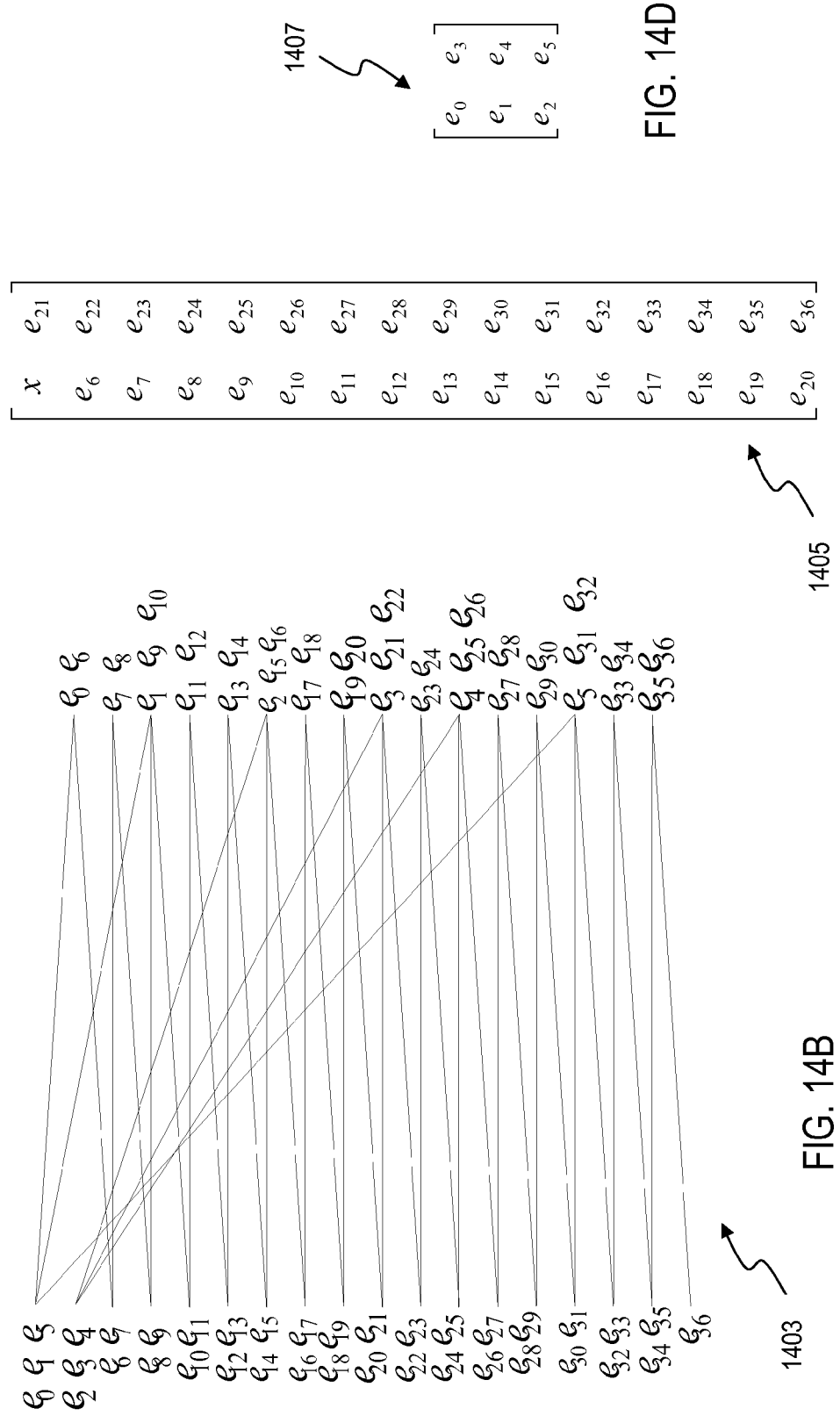

2100

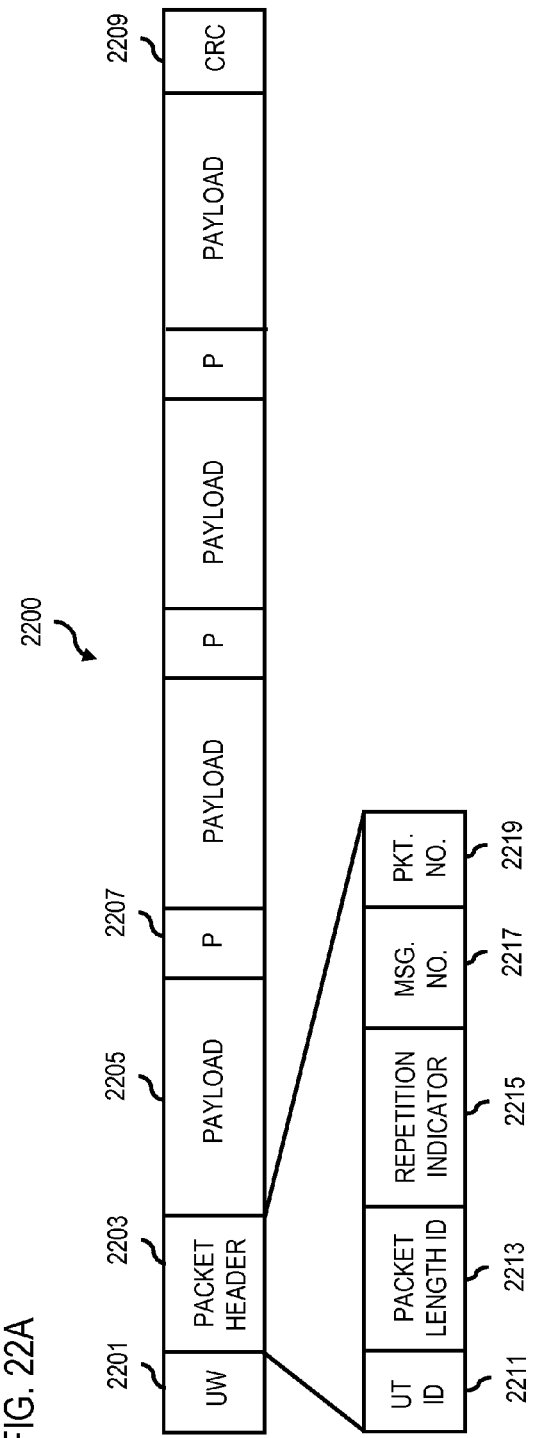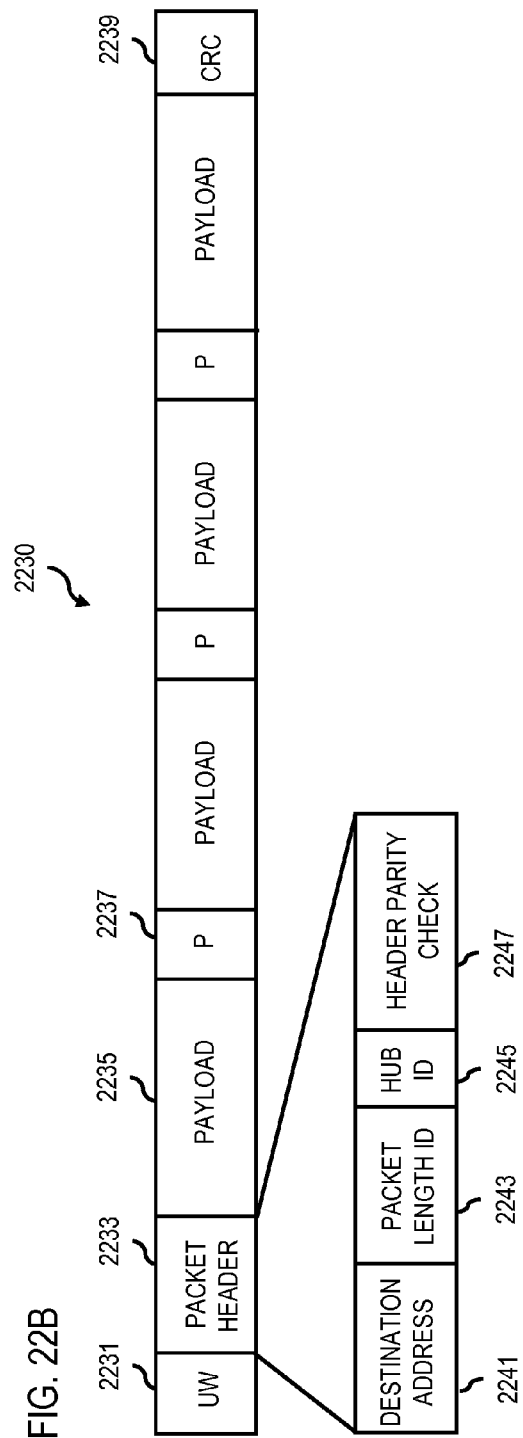

METHOD AND SYSTEM FOR PROVIDING LOW DENSITY PARITY CHECK (LDPC) CODING FOR SCRAMBLED CODED MULTIPLE ACCESS (SCMA)

RELATED APPLICATIONS

This application is a continuation, and claims the benefit of the filing date under 35 U.S.C. 120, of U.S. patent application (Ser. No. 12/686,171) filed Jan. 12, 2010, which is a continuation in part of U.S. patent application (Ser. No. 12/056,144) filed Mar. 26, 2008, which is related to, and claims the benefit of the earlier filing date under 35 U.S.C. §119(e) of, U.S. Provisional Patent Application (Ser. No. 60/908,340) filed Mar. 27, 2007; the entireties of which are incorporated herein by reference.

BACKGROUND INFORMATION

Multiple access schemes are employed by modern radio systems to allow multiple users to share a limited amount of bandwidth, while maintaining acceptable system performance. Common multiple access schemes include Frequency Division Multiple Access (FDMA), Time Division Multiple Access (TDMA), and Code Division Multiple Access (CDMA). System performance is also aided by error control codes. Nearly all communications systems rely on some form of error control for managing errors that may occur due to noise and other factors during transmission of information through a communication channel. These communications systems can include satellite systems, fiber-optic systems, cellular systems, and radio and television broadcasting systems. Efficient error control schemes implemented at the transmitting end of these communications systems have the capacity to enable the transmission of data including audio, video, text, etc. with very low error rates within a given signal-to-noise ratio (SNR) environment. Powerful error control schemes also enable a communications system to achieve target error performance rates in environments with very low SNR, such as in satellite and other wireless systems where noise is prevalent and high levels of transmission power are costly, if even feasible.

Thus, broad classes of powerful error control schemes that enable reliable transmission of information have emerged including convolutional codes, low density parity check (LDPC) codes, and turbo codes. Both LDPC codes as well as some classes of turbo codes have been successfully demonstrated to approach near the theoretical bound (i.e., Shannon limit). Although long constraint length convolutional codes can also approach the Shannon limit, decoder design complexity prevents practical, wide spread adoption. LDPC codes and turbo codes, on the other hand, can achieve low error rates with lower complexity decoders. Consequently, these codes have garnered significant attention.

Traditionally, LDPC codes have not been widely deployed because of a number of drawbacks. One drawback is that the LDPC encoding technique is highly complex. Encoding an LDPC code using its generator matrix would require storing a very large, non-sparse matrix. Additionally, LDPC codes require large blocks to be effective; consequently, even though parity check matrices of LDPC codes are sparse, storing these matrices is problematic. From an implementation perspective, a number of challenges are confronted. For example, storage is an important reason why LDPC codes have not become widespread in practice. Also, a key challenge in LDPC code implementation has been how to achieve the connection network between several processing engines (nodes) in the decoder. Further, the computational load in the decoding process, specifically the check node operations, poses a problem.

Further, conventional data transmission to and from an ultra small terminal via satellite is usually based on Code Division Multiple Access (CDMA) technique using rate ½ or ⅓ turbo codes. CDMA spreads bandwidth to reduce the interference to adjacent satellites, whereas the turbo code provides coding gain needed to close the link. CDMA also allows multiple users sharing the bandwidth at the same time. However, CDMA systems typically need a large bandwidth expansion factor to function properly. Additionally, CDMA systems require all signals accessing the same spectrum at the same time to be of equal power; provision for power control makes CDMA system more complicated to implement. The inherent long propagation delay of a satellite link makes it even more difficult. Moreover, based on different requirements and regulations that are set (for example, by Federal Communications Commission (FCC), International Radio Union), antenna side lobe, power density at antenna flange, off-axis effective isotropic radiate power (EIRP) density, etc. radiated by terminals that communicate via satellite are limited. However, to provide uplink closure at high data rates using small aperture antenna (for example, in small terminals), the regulatory limits can easily be exceeded by conventional satellite transmission means.

Therefore, there is a need for an access scheme based on LDPC encoding that can effectively utilize low code rates, while minimizing complexity. There is also a need for using LDPC codes efficiently to support high data rates, without introducing greater complexity. There is also a need to improve performance of LDPC encoders and decoders. There is also a need to minimize storage requirements for implementing LDPC coding. There is a further need for a scheme that simplifies the communication between processing nodes in the LDPC decoder. Moreover, there is a need for an access scheme that can effectively spread radiated power spectral density by, for example, utilizing low code rates and spectral spreading, while minimizing complexity

SOME EXEMPLARY EMBODIMENTS

These and other needs are addressed by the present invention, wherein a scrambled division multiple access (SDMA) scheme and a spread scrambled division multiple access (SS-DMA) scheme employing low density parity check (LDPC) encoding is provided.

According to one aspect of an exemplary embodiment, a method comprises scrambling a first bit stream from a first terminal according to a first scrambling signature. The method also comprises scrambling a second bit stream from a second terminal according to a second scrambling signature, wherein the first bit stream and the second bit stream are encoded using a low rate code. The first scrambling signature and the second scrambling signature are assigned, respectively, to the first terminal and the second terminal to provide a multiple access scheme.

According to another aspect of an exemplary embodiment, an apparatus comprises a plurality of encoders, each encoder being configured to encode a first data stream from a first terminal and a second data stream from a second terminal using a low code rate. The apparatus also comprises a first scrambler configured to scramble the first bit stream from a first terminal according to a first scrambling signature. The apparatus further comprises a second scrambler configured to scramble the second bit stream from a second terminal according to a second scrambling signature. The first scrambling signature and the second scrambling signature are assigned, respectively, to the first terminal and the second terminal to provide a multiple access scheme.

According to another aspect of an exemplary embodiment, a method comprises applying joint detection and interference cancellation on a received composite signal, wherein the composite signal includes one or more encoded bit streams having a low code rate. The method also comprises estimating the encoded bit streams, descrambling the estimated bit streams, and decoding the descrambled bit streams. The method further comprises modifying the composite signal based on the decoded bit stream, and iteratively decoding bit streams of the modified composite signal.

According to yet another aspect of an exemplary embodiment, a system comprises a joint detector and interference canceller configured to detect and cancel interference from a received composite signal, wherein the composite signal includes one or more encoded bit streams having a low code rate. The system also comprises a demodulator configured to estimate the encoded bit streams, a plurality of descramblers configured to descramble the estimated bit streams, and a plurality of decoders configured to decode the bit streams. The system further comprises a plurality of scramblers configured to re-scramble the decoded bit streams, wherein the joint detector and interference canceller is further configured to modify the composite signal for subsequent iterative decoding by the decoders.

Still other aspects, features, and advantages of the present invention are readily apparent from the following detailed description, simply by illustrating a number of particular embodiments and implementations, including the best mode contemplated for carrying out the present invention. The present invention is also capable of other and different embodiments, and its several details can be modified in various obvious respects, all without departing from the spirit and scope of the present invention. Accordingly, the drawing and description are to be regarded as illustrative in nature, and not as restrictive.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2 is a diagram of a transmitter configured to operate in the systems of FIGS. 1A and 1B, according to an exemplary embodiment;

FIG. 3 is a diagram of a receiver configured to operate in the systems of FIGS. 1A and 1B, according to an exemplary embodiment;

FIGS. 4A and 4B, are, respectively, a diagram of a system capable of supporting multiple transmitters using a SDMA scheme employing low density parity check (LDPC) encoding, and a flowchart of an associated scrambling process, according to an exemplary embodiment;

FIG. 7 is a diagram of a sparse parity check matrix, in accordance with an exemplary embodiment;

FIG. 8 is a diagram of a bipartite graph of an LDPC code of the matrix of FIG. 7, according to an exemplary embodiment;

FIG. 9 is a diagram of a sub-matrix of a sparse parity check matrix, wherein the sub-matrix contains parity check values restricted to the lower triangular region, according to an exemplary embodiment;

FIGS. 13A-13D are diagrams of parity check matrix, bipartite graph, top edge RAM, and bottom edge RAM, respectively, to support structured access as to realize randomness in LDPC coding/decoding, according to an exemplary embodiment;

FIGS. 14A-14D are diagrams of parity check matrix, bipartite graph, top edge RAM, and bottom edge RAM, respectively, to support structured access as to realize randomness in LDPC coding/decoding, according to another exemplary embodiment;

FIGS. 22A and 22B are, respectively, diagrams of burst format for return path transmission and forward path transmission, according to various exemplary embodiments.

DESCRIPTION OF PREFERRED EMBODIMENTS

A method, system, and software for providing a scrambled division multiple access (SDMA) scheme and a spread scrambled division multiple access (SSDMA) scheme employing low density parity check (LDPC) encoding and efficiently decoding structured LDPC codes is described. In the following description, for the purposes of explanation, numerous specific details are set forth in order to provide a thorough understanding of the invention. It is apparent, however, that the invention may be practiced without these specific details or with an equivalent arrangement. In other instances, well-known structures and devices are shown in block diagram form in order to avoid unnecessarily obscuring the invention.

Although certain embodiments of the present invention are described with respect to low density parity check (LDPC) codes, it is contemplated that these embodiments have applicability to low-rate codes in general (e.g., low-rate turbo codes). Also, although certain embodiments of the present invention are described with respect to scramblers, it is contemplated that these embodiments have applicability to any multi-user discrimination methods (e.g., interleavers, multiple access schemes, etc.).

Figure 1A:
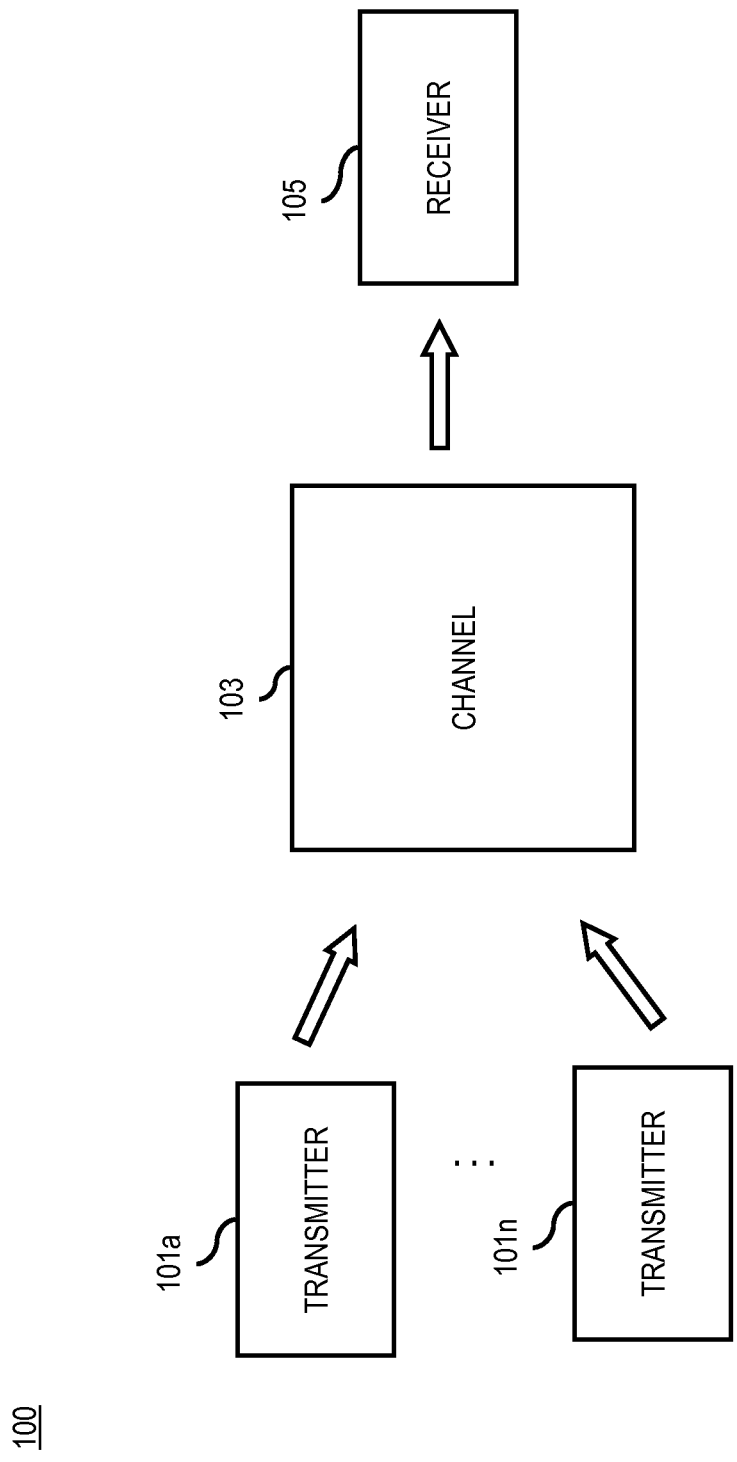
FIGS. 1A and 1B are communications systems capable of providing a scrambled division multiple access (SDMA) scheme employing low density parity check (LDPC) encoding, according to various exemplary embodiments.
Figure 1B:
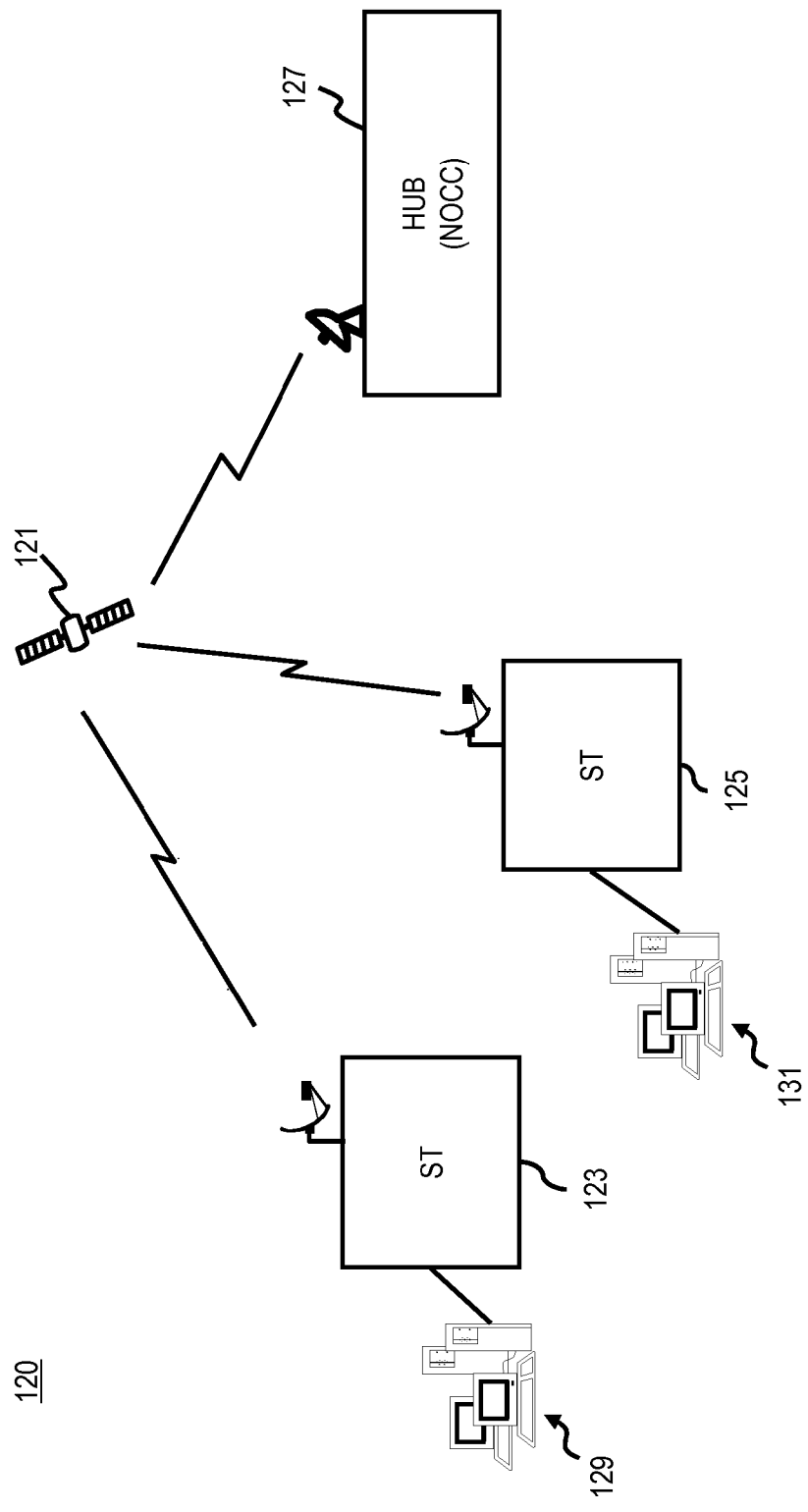

FIGS. 1A and 1B are communications systems capable of providing a scrambled division multiple access (SDMA) scheme, according to various exemplary embodiments. A digital communications system 100 includes one or more transmitters 101 that generate signal waveforms across a communication channel 103 to one or more receivers 105 (of which one is shown). In this discrete communications system 100, the transmitter 101 has a message source that produces a discrete set of possible messages; each of the possible messages has a corresponding signal waveform. These signal waveforms are attenuated, or otherwise altered, by communications channel 103. To combat the noise channel 103, coding is utilized. For example, forward error correction (FEC) codes can be employed.

Forward error correction (FEC) is required in terrestrial and satellite systems to provide high quality communication over a radio frequency (RF) propagation channel, which induces signal waveform and spectrum distortions, including signal attenuation (freespace propagation loss) and multi-path induced fading. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communications systems continue to evolve in order to satisfy increased system requirements for new higher rate or higher fidelity communication services.

Code rate is an important factor that has a significant effect on the error performance of the code. The choice of which code rate to operate, in turn, depends on the SNR of the environment in which the codes will be deployed. Traditionally, low SNR environments require the use of low code rates (i.e., more redundancy), whereas high SNR environments can enable the utilization of higher code rates. There is a continual challenge to devise codes that edge closer to the Shannon limit, while minimizing complexity.

The LDPC codes that are generated by the transmitter 101 enable high speed implementation without incurring any performance loss. These structured LDPC codes output from the transmitter 101 avoid assignment of a small number of check nodes to the bit nodes already vulnerable to channel errors by virtue of the modulation scheme.

Such LDPC codes have a parallelizable decoding algorithm (unlike turbo codes), which advantageously involves simple operations such as addition, comparison, and table look-up. Moreover, carefully designed LDPC codes do not exhibit any sign of error floor.

According to one embodiment of the present invention, the transmitter 101 generates, using a relatively simple encoding technique, LDPC codes based on parity check matrices (which facilitate efficient memory access during decoding) to communicate with the receiver 105. The transmitter 101 employs LDPC codes that can outperform concatenated turbo+RS (Reed-Solomon) codes, provided the block length is sufficiently large.

FIG. 1B is a diagram of an exemplary meshed network capable of supporting communication among terminals with varied capabilities, according to an embodiment of the present invention.

Satellite communications system 120 includes a satellite 121 that supports communication among multiple satellite terminals (STs) 123, 125 and a hub 127. The hub 127 may assume the role of a Network Operations Control Center (NOCC), which controls the access of the STs 123, 125 to the network 120 and also provides element management functions and control of the address resolution and resource management functionality. The satellite 121, in an exemplary embodiment, operates as a packet switch (e.g., at a data link layer) that provides direct unicast and multicast communication among the STs 123, 125. The STs 123, 125 provide connectivity to one or more hosts 129, 131, respectively. According to one embodiment of the present invention, the system 120 has a fully meshed architecture, whereby the STs 123, 125 may directly communicate.

As previously discussed, a system in which terminals are deployed, particularly a satellite system, incompatibility problems may arise if different "generations" of terminals exist, in which one ST employs older hardware and/or software technologies than the other.

For newer, highly capable terminals to communicate with older (typically) less capable terminals, an exchange of information regarding the capabilities among the communicating terminals is needed. Specifically, the common air interface needs to support a discovery of the terminal's capabilities profile (or context information). These capabilities can include encryption scheme, compression scheme, segmentation and reassembly (SAR) scheme, automatic repeat request (ARQ) scheme, Quality-of-Service (QoS) parameters, power levels, modulation and coding schemes, power control algorithms, and link adaptation capabilities.

Under a conventional approach, terminal profile can be readily exchanged over a network with a star topology where no peer-to-peer communication exists. For example, in the General Packet Radio Service (GPRS)/Universal Mobile Telecommunications System (UMTS) family of protocols, such capabilities profiles include a packet data protocol (PDP) context and a mobility management context. In an exemplary embodiment, the concepts of PDP context and mobility management context are combined and the term packet data protocol (PDP) context is used in general to refer to terminal capabilities. It is recognized that these terminals can be mobile as well as non-mobile. According to an exemplary embodiment, this PDP context, for example, which can provide information about the encryption algorithm, compression algorithm, modes of data link layer communication, and physical layer transfer capabilities is combined by the transmit ST with the Quality of Service (QoS) of a pending data flow to determine a packet transfer context to use in transmission of the flow. If a PDP context has been previously established, then the sending ST can autonomously create the packet transfer context, which both satisfies the QoS of the data flow and is compatible with the receive ST capabilities.

According to one embodiment, the exchange of terminal profile can be executed over a meshed network, in a peer-to-peer manner. The STs 123, 125 support the use of a negotiation procedure to determine the optimal configuration for transmission and reception of data. If a protocol implements control procedures or options in newer versions (i.e., flow-control/rate-control), older protocol versions are able to detect the initiation as a new unsupported procedure and report the same to the peer with minimal disruption in the flow of traffic.

The ST-ST protocol advantageously takes into account that even for peers of the same version, some capabilities may not necessarily be always supported due to local temporal processing/memory/congestion-related constraints. Additionally, the ST-ST protocol design provides for rapid developments in data communication technology.

Incompatibility between two STs is detected by the terminal that originates the traffic. Thus, potential misconfigurations or software incompatibilities can at least be identified, without requiring communication at the service level of the more capable ST. For example, one of the STs 123, 125 may need to be reconfigured in order to communicate with compression disabled in order to allow communication with an ST that does not support compression. It is noted that the capability is not necessarily a function of solely configuration or software compatibility, but may also be a function of current traffic load.

For each ST 123, 125, there exist some configuration information, including network configuration, network service provider (NSP) configuration, software configuration, and user configuration, as indicated by the NOCC 127. These configurations relate to the features that the ST 123, 125 supports and offers to the user, and have a direct bearing on the transmission and reception capabilities.

To facilitate the flow of data from one peer ST 123 to another ST 125 of possibly different generations equipped with different capabilities, a packet transfer context is employed. Such a common feature set depends on the PDP contexts of the two STs 123, 125; further, this common feature set may also depend on the QoS of the flow, as well as the loading and status of the two STs at that point of time. In an exemplary embodiment, the packet transfer context is unidirectional and valid only for the transmit ST to send packets to the specified receive ST; thus, the packet transfer context may be unique to a given pair of STs.

FIG. 2 is a diagram of a transmitter configured to operate in the systems of FIGS. 1A and 1B. As seen in FIG. 2, a transmitter 200 is equipped with a channel encoder (e.g., LDPC encoder) 201 that accepts input from an information source and outputs coded stream of higher redundancy suitable for error correction processing at the receiver (as shown in FIG. 3). The information source generates k signals from a discrete alphabet, X.

Essentially, the encoder 201 generates signals from alphabet Y to a channel scrambler 203, which scrambles the alphabet. That is, the channel scrambler 203 pseudo-randomizes the code symbols. The scrambled signals are fed to a modulator 205, which maps the encoded messages from encoder 201 to signal waveforms that are transmitted to a transmit antenna 207.

The antenna 207 emits these waveforms over the communication channel 103. Accordingly, the encoded messages are modulated and distributed to a transmit antenna 207.

The transmissions from the transmit antenna 207 propagate to a receiver, as discussed below.

According to certain embodiments, the systems 100 and 120 of FIGS. 1A and 1B, respectively, are configured to support multiple access schemes. Therefore, as mentioned above, although certain embodiments are described with respect to scramblers (for example scrambler 203 of FIG. 2 and scrambler 1703 of FIG. 17), however it is contemplated that any convertor that can manipulate data streams and can support multi-user discrimination can be used (e.g., interleaver, randomizer, etc.).

The LDPC 201 encoder systematically encodes an input block of size $k_{ldpc}$, $i=(i_0, i_1, \ldots, i_{k_{ldpc}-1})$ onto a codeword of size $n_{ldpc}$, $c=(i_0, i_1, \ldots, i_{k_{ldpc}-1}, p_0, p_1, \ldots p_{n_{ldpc}-k_{ldpc}-1})$. The transmission of the codeword starts in the given order form $i_0$ and ends with $p_{n_{ldpc}-k_{ldpc}-1}$. For SCMA application, the relevant code rate and block sizes for LDPC are given in Table 1.

TABLE 1

| LDPC Code Parameters ($n_{ldpc}$, $k_{ldpc}$) | | | |
| --- | --- | --- | --- |
| Rate | Modulation | $k_{ldpc}$ | $n_{ldpc}$ |
| 1/9 | QPSK | 400 | 3600 |
| 1/15 | QPSK | 400 | 6000 |

The task of the LDPC encoder 201 is to determine $n_{ldpc}-k_{ldpc}$ parity bits $(p_0, p_1, \ldots, p_{n_{ldpc}-k_{ldpc}-1})$ for every block of $k_{ldpc}$ information bits $(i_0, i_1, \ldots, i_{k_{ldpc}-1})$. The procedure is as follows. First the parity bits are initialized: $p_0=p_1=p_2=\ldots=p_{n_{ldpc}-k_{ldpc}-1}=0$. The first information bit, $i_0$, is accumulated at parity bit addresses specified in the first row of Table 3 or Table 4. For example, for rate 1/9 (Table 3), the following results:

$$p_{1380}=p_{1380} \oplus i_0$$

$$p_{2744}=p_{2744} \oplus i_0$$

(All additions are in Galois Field 2 (GF(2))).

For the next M−1 information bits, $i_m$, m=1, 2, ..., M−1 the information bits $i_m$ are accumulated at parity bit addresses $\{x+m \bmod M \times q\} \bmod(n_{ldpc}-k_{ldpc})$, where x denotes the address of the parity bit accumulator corresponding to the first bit $i_0$, and M and q are code dependent constants specified in Table 2. Continuing with the example, M=50, q=64 for the rate 1/9 code. So for example, for input bit $i_1$, the following operations are performed, $$p_{1444}=p_{1444} \oplus i_1$$

$$p_{2808}=p_{2808} \oplus i_1$$

For the $(M+1)^{st}$ information bit $i_M$, the addresses of the parity bit accumulators are given in the second row of the Table 3 (or Table 4). In a similar manner the addresses of the parity bit accumulators for the following M−1 information bits $i_m$, m=M+1, M+2, ..., 2M−1 are obtained using the formula $\{x+m \bmod M \times q\} \bmod(n_{ldpc}-k_{ldpc})$, where x denotes the address of the parity bit accumulator corresponding to the information bit $i_M$, i.e., the entries in the second row of the Table 3 (or Table 4).

In a similar manner, for every group of M new information bits, a new row from Tables 3 (or Table 4) is used to find the addresses of the parity bit accumulators.

After all of the information bits are exhausted, the final parity bits are obtained as follows. The following operations are sequentially performed, starting with i=1

$$p_i=p_i \oplus p_{i-1}, i=1,2,\ldots, n_{ldpc}-k_{ldpc}-1$$

Final content of $p_i$, i=0, 1, ..., $n_{ldpc}-k_{ldpc}-1$ is equal to the parity bit $p_i$.

TABLE 2

| Code Rate | M | q |
|---|---|---|
| 1/9 | 50 | 64 |
| 1/15 | 100 | 56 |

TABLE 3

Address of Parity Bit Accumulators (Rate 1/9 N = 3600) (Encoder)

1380 2744
332 2984
2784 2624
92 596
180 1160
464 1624
2556 1580
708 1008

TABLE 4

Address of Parity Bit Accumulators
(Rate 1/15 N = 6000) (Encoder)

4788 4536
2849 2282
1750 2947
1197 4151

Further, Table 5 illustrates degree distributions of bit nodes and check nodes, according to an exemplary embodiment.

TABLE 5

| | Degree | |
|---|---|---|
| Rate | 2 | 1 |
| 1/9 | 3599 | 1 |
| 1/15 | 5999 | 1 |

According to an exemplary embodiment, for the $n^{th}$ check node, the degree is 3, if n mod 4=0, otherwise the degree is 2 (for rate 1/9 code) and for the $n^{th}$ check node, the degree is 3, if n mod 7=0, otherwise the degree is 2 (for rate 1/15 code). However, exception for both codes can include check node degree be 2 for n=0.

FIG. 3 is a diagram of a receiver configured to operate in the systems of FIGS. 1A and 1B. At the receiving side, a receiver 300 includes an antenna 301 that receives the waveforms emitted over the channel 103. The receiver 300 provides a demodulator 303 that performs demodulation of the received signals. After demodulation, the received signals are forwarded to a channel de-scrambler 305 to unscramble the symbols. A decoder 307 then attempts to reconstruct the original source messages. Exemplary embodiments corresponding to LDPC decoding are more fully described with respect to FIGS. 10-12.

It is contemplated that the above transmitter 200 and receiver 300 can be deployed within a single wireless terminal, in which case a common antenna system can be shared. The wireless terminal can for example be configured to operate within a satellite communication, a cellular system, wireless local area network (WLAN), etc.

Figure 4B:
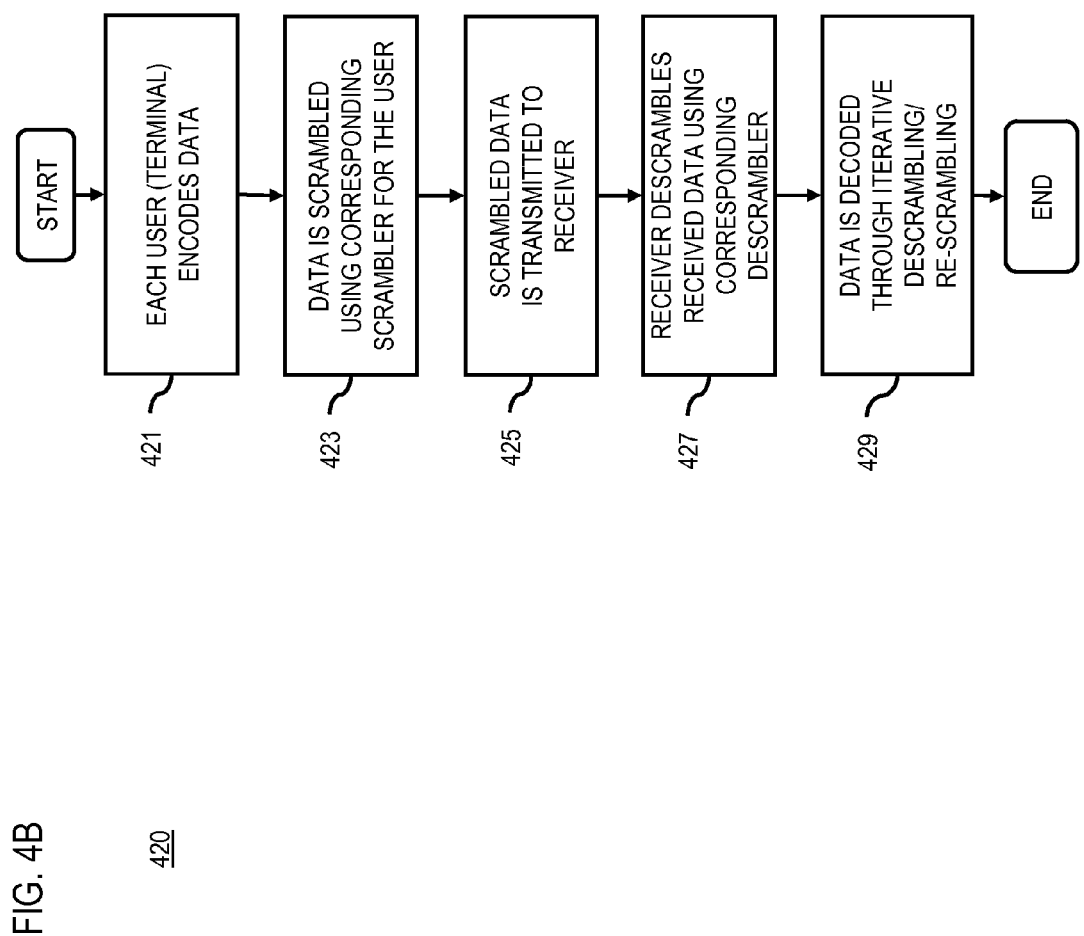

FIGS. 4A and 4B, are, respectively, a diagram of a system capable of supporting multiple transmitters using a SDMA scheme employing low-rate LDPC codes, and a flowchart of an associated scrambling process, according to an exemplary embodiment. For the purpose of illustration, a communication system 400 supports multiple terminals (i.e., users) configured with respective encoders 401a-401n and scramblers 403a-403n. In an exemplary embodiment, these terminals can be the transmitter 200 and the receiver 300 of FIGS. 2 and 3, respectively, operating in the satellite system 120 of FIG. 1B.

By way of example, the system 400 provides a multiple access scheme, such as SCMA, which achieves good performance with relatively lower receiver complexity compared to CDMA (as the number of users that share the same channel increases). With SCMA, each user sharing the transmission channel is separated by user specific and scramblers 403a-403n. Also, due to lack of spreading factor and more efficient FEC coding, a fraction of a satellite transponder is needed under the SCMA scheme, thereby lowering the operating cost.

By using low rate codes, the system 400 can achieve greater power efficiency while spreading the spectrum, whereas conventional CDMA does not. Additionally, SCMA is different from another multiple access technique called Interleave-Division Multiple Access (IDMA) which also spreads with low-rate turbo-Hadamard codes but uses random interleavers as user signature. The turbo-Hadamard codes are not straightforward to implement since they require the decoding of Hadamard codes in addition to the decoding of turbo-like codes. Also, all the users can utilize the same scrambler hardware with different initial vector (also known as "seed"), instead of different interleaver design. Further, using scrambling sequences as signatures is simpler than random interleaver-based signatures.

In one embodiment, each of LDPC encoders 401a-401n utilizes the same LDPC codes. The LDPC encoded sequences are then fed to the respective user-specific scramblers 403a-403n. The scrambled sequences are then transmitted over channel 405 to a receiver 300, which includes a joint detector/interference canceller unit 407 that interacts with the LDPC decoders 413a-413n to iteratively produce an estimate of the received codewords. With each iteration, the LDPC decoder 413a-413n produces a better estimate to the joint detector/interference canceller 407 for achieving better cancellation. The information exchanged between LDPC decoders 413a-413n and the joint detector/interference canceller 407 is scrambled or descrambled via scramblers 411a-411n or de-scramblers 409a-409n, respectively. Once "good" estimates of the decoded sequences are produced, they are output from the LDPC decoders 413a-413n.

Unlike conventional CDMA systems, the joint-detection/interference canceller 407 does not require all the signals accessing the same spectrum at the same time to be of equal power. In fact, the performance is better when the signals are of different power level. Thus, no tight power controls are needed. Also, due to joint-detection/interference cancellation, the system 400 provides a scheme that is much more robust against Rician fading, which makes it particularly more attractive for small mobile terminals experiencing Rician multipath fading.

Therefore, the system 400, as a SCMA system using low-rate FEC coding, requires less power to transmit data at the same speed vis-à-vis a CDMA system. In one embodiment, the system 400 can be operated in a random access manner and does not require reservation of time slots, which minimize the delay to one satellite round trip. Additionally, the system 400, as mentioned, does not require tight power control, minimizing the coordination needed between transmitter 200 and receiver 300. By way of example, potential applications will be for mobile or aeronautical terminals. It may also have applications to enable direct broadcast satellite (DBS) operators to provide return link over satellite via a commercial satellite using existing antenna systems.

Each user encodes its data with, for example, a rate 1/n FEC, where n is an integer larger than 3. The coded bits are then scrambled with a unique scrambling sequence and transmitted. The number of unique sequences are virtually unlimited with common sequence generators, such as the Gold sequences. The same generator can generate all the sequences, which are differentiated by the initial vector. It is noted that other low rates can be utilized, m/n (e.g., less than ⅓).

In an exemplary embodiment, the scrambling sequence can be generated by selecting a pseudorandom number sequence (e.g., Gold sequence) whose period is greater than the code block. On the receiver side, the respective user uses the corresponding de-scrambler and a rate 1/n decoder to retrieve its data. The signals are modulated by the same type of modulation, e.g., QPSK, of the same bandwidth, centered at the same frequency and transmitted at the same time (e.g., similar to CDMA). Typically, for receivers located in a hub of a star-shaped network, the antennas can be shared.

The system 400 operates as follows. In step 421, each terminal encodes data using the corresponding LDPC encoder (e.g., 401a-401n). The encoded data is then scrambled by the respective scramblers 1 . . . U (e.g., 403a-403n) and transmitted to the receiver 300, per steps 423 and 425. Next, the received signal is processed by the joint detector/interference canceller 407 and undergoes descrambling and re-scrambling, as in step 427. The descrambling and re-scrambling is performed in conjunction with the decoding process, which outputs decoded data (step 429).

Figure 5:
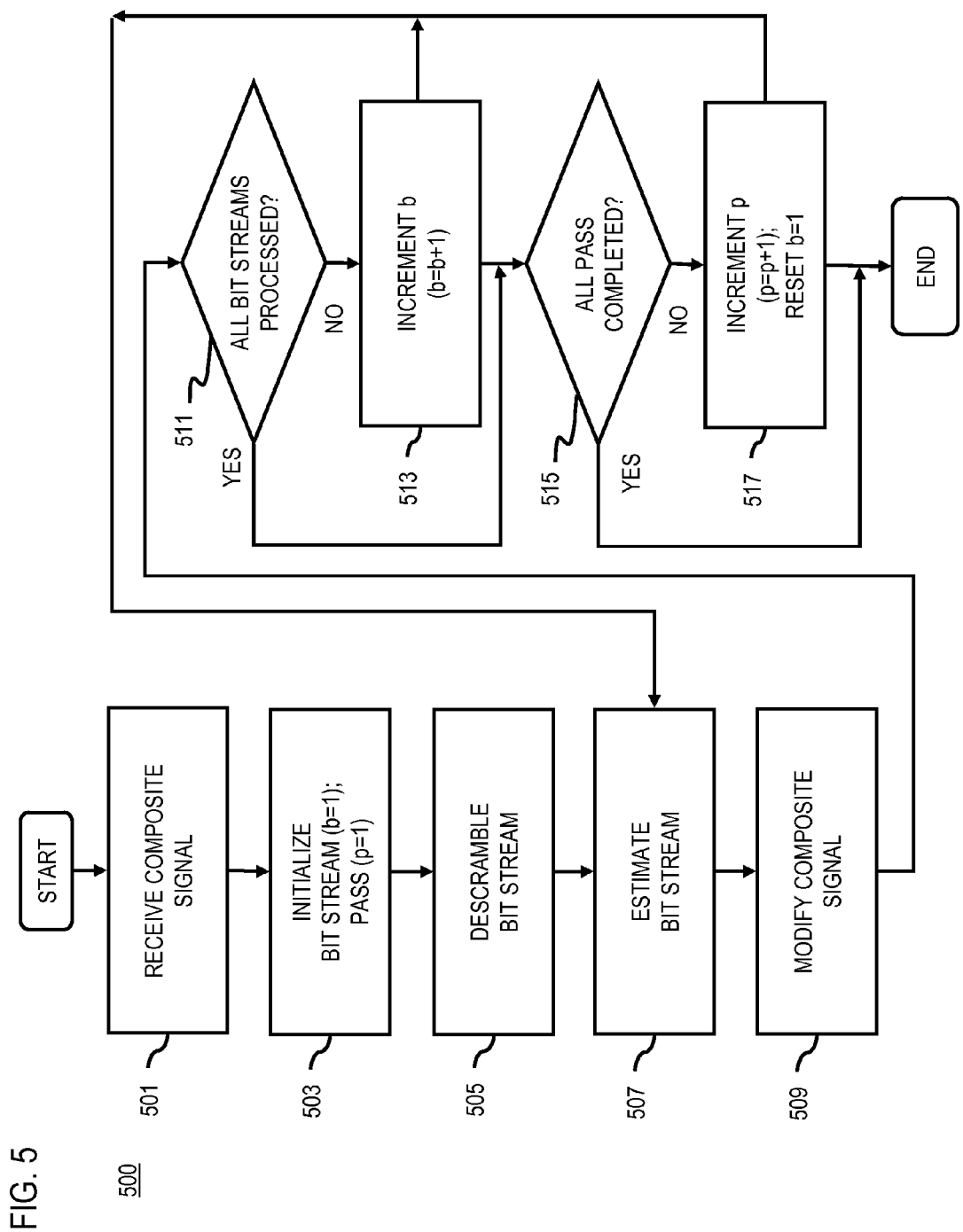
FIG. 5 is a flowchart of a process for joint detection/interference cancellation in the system of FIG. 4A, according to an exemplary embodiment.

FIG. 5 is a flowchart of a process for joint detection/interference cancellation in the system of FIG. 4A, according to an exemplary embodiment. A key enabler for this communication system 400 is the joint-detection/interference cancellation receiver. This receiver 300 includes the descramblers 409a-409n and the decoders 413a-413n as well as all the signal estimators and interference reducers for each of the individual signal paths. In addition, the receiver 300 includes a buffer (not shown) to store a complete block of the composite signal. The receiver 300 employs joint detection/estimation; it is contemplated that any joint-detection/estimation technique may be used. In an exemplary embodiment, the receiver 300 operates iteratively to output the bit streams represented by the composite signal.

As seen in FIG. 5, in steps 501-507, once an entire block of composite waveform is sampled and stored in the buffer, the receiver 300 first uses the first descrambler (e.g., descrambler 409a) and a LDPC decoder (e.g., decoder 413a) to estimate the first bit-stream. In step 509, the composite signal is modified accordingly. In this example, only one pass of the LDPC decoding is performed. The interference reducer then operates on the stored waveform given the result of the first pass decoding of the first signal. The receiver 300 then uses the second descrambler (e.g., descrambler 409b) and LDPC decoder (e.g., decoder 413b) to estimate the second bit-stream, and so on. When all the bit-streams have been estimated once (as determined in step 511), the receiver 300 than returns to process the first bit-stream in a second pass.

When all the bit-streams have been processed for the required number passes (steps 513-517), all the bit-streams are completely estimated and decoded.

Alternatively, in another embodiment, all the paths can be processed in-parallel for each pass; this approach may entail more passes than the above process.

Signal estimation, via a demodulator (not shown), plays an important role. In most applications of interest, this demodulator must operate at very low signal-to-noise plus interference ratio. In one embodiment, the demodulator is aided by two features: synchronization, and joint detection. The initial synchronization involves use of a known pilot symbol, which can be introduced using anyone of the techniques known in the art. For example, known pilot symbols can be introduced by multiplexing them into the data stream, or pilot symbols may be introduced by puncturing the encoder output. Just as each scrambler 403a-403n employs a different scrambling signature, each may employ a different pilot symbol pattern, thereby minimizing interference effects.

In one embodiment, the signals are transmitted in a burst mode. Accordingly, the demodulator is configured to detect the burst arrival times by using, for example, a "Unique Word" pattern. It is recognized that any other well-known techniques may be used for this purpose. The Unique Word patterns of the various encoders may or may not be distinct.

With respect to joint detection, this process involves iterative refinement of the demodulation. As the iteration progresses, the demodulation is improved through two techniques. First, as interference is removed, the estimation of signal parameters (e.g., frequency, symbol timing, carrier phase) is improved. Secondly, as more reliable estimates of the data symbols become available from the LDPC decoders 413a-413n, these are used to improve the demodulator performance.

In the return link, the combination of low-rate code and SCMA allows the terminal to operate autonomously with minimum coordination with the hub. Unlike conventional CDMA, interference cancellation operates better when the terminals are not operating at exactly the same power, tight power control is in fact not desirable. The bandwidth expansion from the low-rate coding serves two purposes reduction of emission spectral density from regulator standpoint; and additional coding gain.

Figure 6:
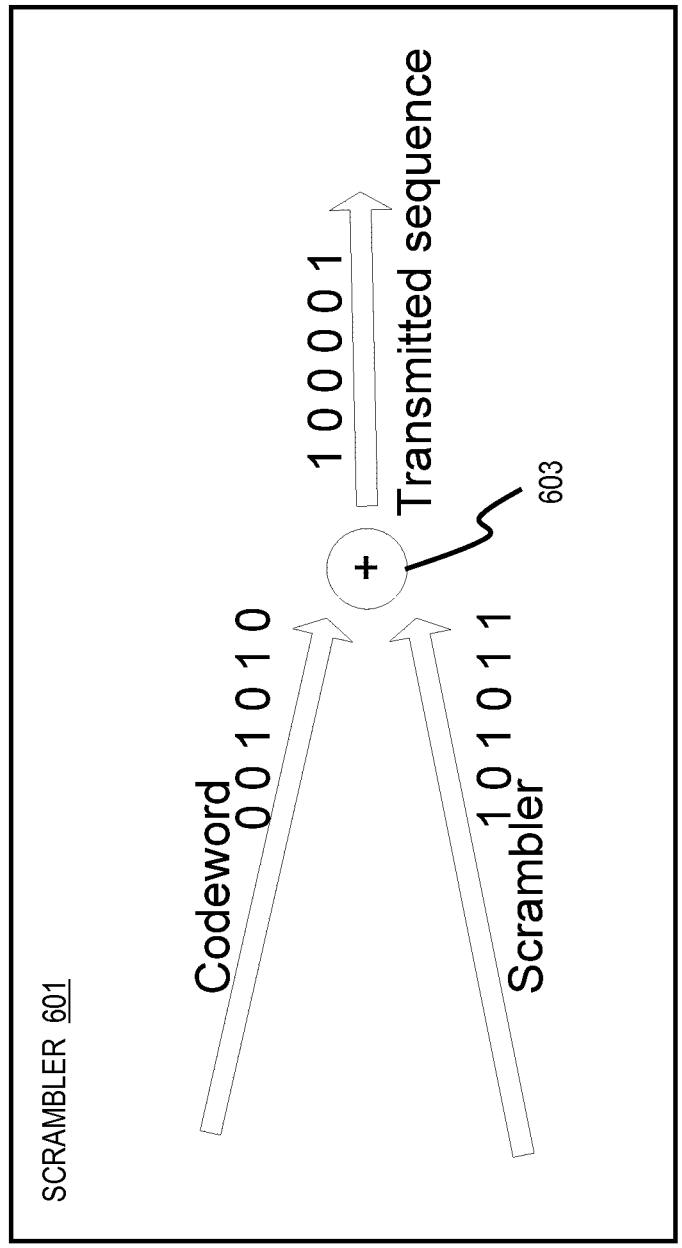
FIG. 6 is a diagram of a scrambler, in accordance with various exemplary embodiments.

FIG. 6 is a diagram of a scrambler, in accordance with various exemplary embodiments. In this example, a scrambler 601 receives a codeword (e.g., "0 0 1 0 1 0") and a scrambling sequence (e.g., "1 0 1 0 1 1"). The scrambling sequence (or signature) can be a Gold sequence or any pseudorandom number sequence. Gold codes exhibit a number of characteristics. In addition to being simple to generate, these sequences contain roughly an equal number of zeros and ones, and are approximately orthogonal when delayed or shifted. Also, they are orthogonal to other codes. Gold sequences can be generated using feedback shift registers, whose outputs are added to produce the Gold codes. The codeword and scrambling sequence are combined by adder 603 to output a transmitted sequence (e.g., "1 0 0 0 0 1").

As mentioned, use of scramblers (as opposed to interleavers) reduces complexity. In a large system with numerous users, it is difficult to deploy a large number of interleavers that are prearranged between each pair of sender and receiver, whereas a common scrambler with different initial vector (also known as "seed") can be used for each pair of sender and receiver. Such arrangement is substantially easier to implement.

To appreciate the advantages offered by exemplary embodiments, it is instructive to examine how LDPC codes are generated, as discussed in FIG. 7. FIG. 7 is a diagram of a sparse parity check matrix, in accordance with an embodiment of the present invention. LDPC codes are long, linear block codes with sparse parity check matrix $H_{(n-k)\times n}$. Typically the block length, n, ranges from thousands to tens of thousands of bits. For example, a parity check matrix for an LDPC code of length n=8 and rate ½ is shown in FIG. 7. The same code can be equivalently represented by the bipartite graph, per FIG. 8.

FIG. 8 is a diagram of a bipartite graph of an LDPC code of the matrix of FIG. 7. Parity check equations imply that for each check node, the sum (over GF (Galois Field)(2)) of all adjacent bit nodes is equal to zero. As seen in FIG. 8, bit nodes occupy the left side of the graph and are associated with one or more check nodes, according to a predetermined relationship. For example, corresponding to check node $m_1$, the following expression exists $n_1+n_4+n_5+n_8=0$ with respect to the bit nodes.

Returning to the receiver 300, the LDPC decoder 307 can be considered a message passing decoder, whereby the decoder 307 aims to find the values of bit nodes. To accomplish this task, bit nodes and check nodes iteratively communicate with each other. The nature of this communication is described below.

From check nodes to bit nodes, each check node provides to an adjacent bit node an estimate ("opinion") regarding the value of that bit node based on the information coming from other adjacent bit nodes. For instance, in the above example if the sum of $n_4$, $n_5$ and $n_8$ "looks like" 0 to $m_1$, then $m_1$ would indicate to $n_1$ that the value of $n_1$ is believed to be 0 (since $n_1+n_4+n_5+n_8=0$); otherwise $m_1$ indicate to $n_1$ that the value of $n_1$ is believed to be 1. Additionally, for soft decision decoding, a reliability measure can be added.

From bit nodes to check nodes, each bit node relays to an adjacent check node an estimate about its own value based on the feedback coming from its other adjacent check nodes. In the above example $n_1$ has only two adjacent check nodes $m_1$ and $m_3$. If the feedback coming from $m_3$ to $n_1$ indicates that the value of $n_1$ is probably 0, then $n_1$ would notify $m_1$ that an estimate of $n_1$'s own value is 0. For the case in which the bit node has more than two adjacent check nodes, the bit node performs a majority vote (soft decision) on the feedback coming from its other adjacent check nodes before reporting that decision to the check node it communicates. The above process is repeated until all bit nodes are considered to be correct (i.e., all parity check equations are satisfied) or until a predetermined maximum number of iterations is reached, whereby a decoding failure is declared.

FIG. 9 is a diagram of a sub-matrix of a sparse parity check matrix, wherein the sub-matrix contains parity check values restricted to the lower triangular region, according to an exemplary embodiment. The encoder 201 (of FIG. 2) can employ a simple encoding technique by restricting the values of the lower triangular area of the parity check matrix. According to an exemplary embodiment, the restriction imposed on the parity check matrix is of the form:

$$H_{(n-k)\times n}=[A_{(n-k)\times k}B_{(n-k)\times(n-k)}],$$

where B is lower triangular.

Any information block $i=(i_0, i_1, \ldots, i_{k-1})$ is encoded to a codeword $c=(i_0, i_1, \ldots, i_{k-1}, p_0, p_1, \ldots p_{n-k-1})$ using $Hc^T=0$, and recursively solving for parity bits; for example, $$a_{00}i_0+a_{01}i_1+\ldots+a_{0,k-1}i_{k-1}+p_0=0 \Rightarrow \text{Solve } p_0$$

$$a_{10}i_0+a_{11}i_1+\ldots+a_{1,k-1}i_{k-1}+b_{10}p_0+p_1=0 \Rightarrow \text{Solve } p_1$$

and similarly for $p_2, p_3, \ldots, p_{n-k-1}$.

Figure 10:
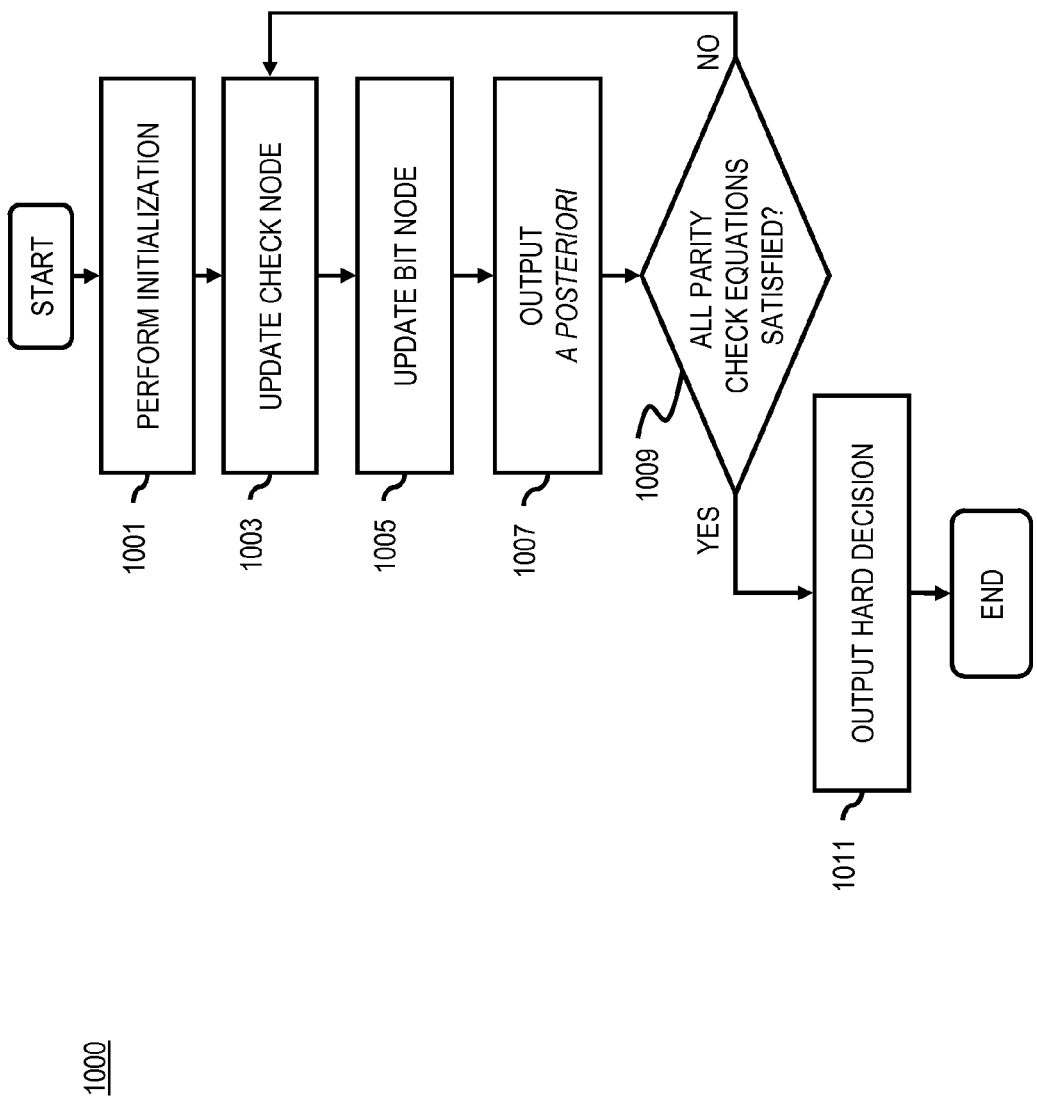
FIG. 10 is a flow chart of the operation of the LDPC decoder of FIG. 3, according to an exemplary embodiment.

FIG. 10 is a flow chart of the operation of the LDPC decoder of FIG. 3, according to an exemplary embodiment.

Figure 11A:
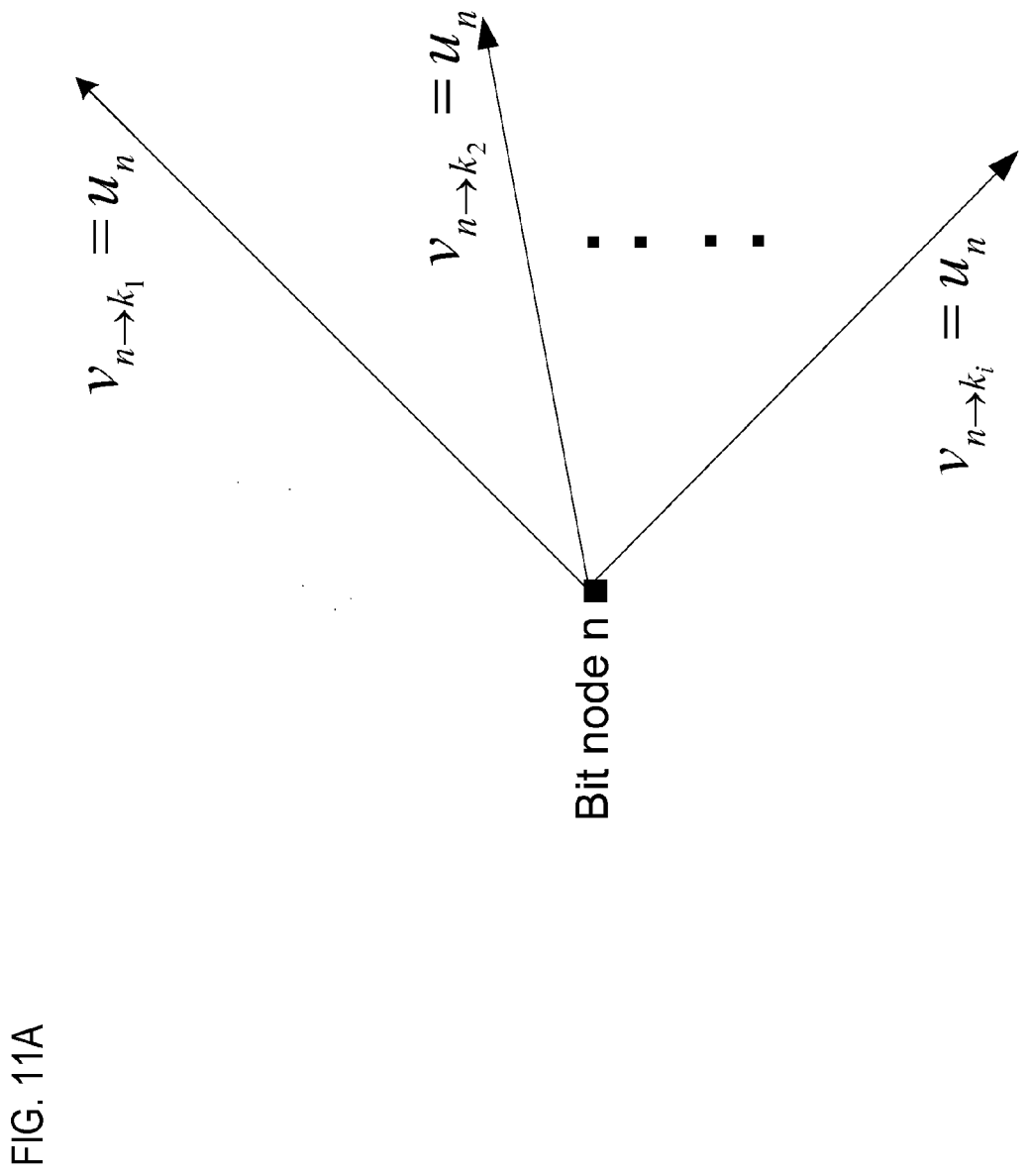
FIGS. 11A-11C are diagrams of the interactions between the check nodes and the bit nodes in a decoding process, according to an exemplary embodiment.
Figure 11B:
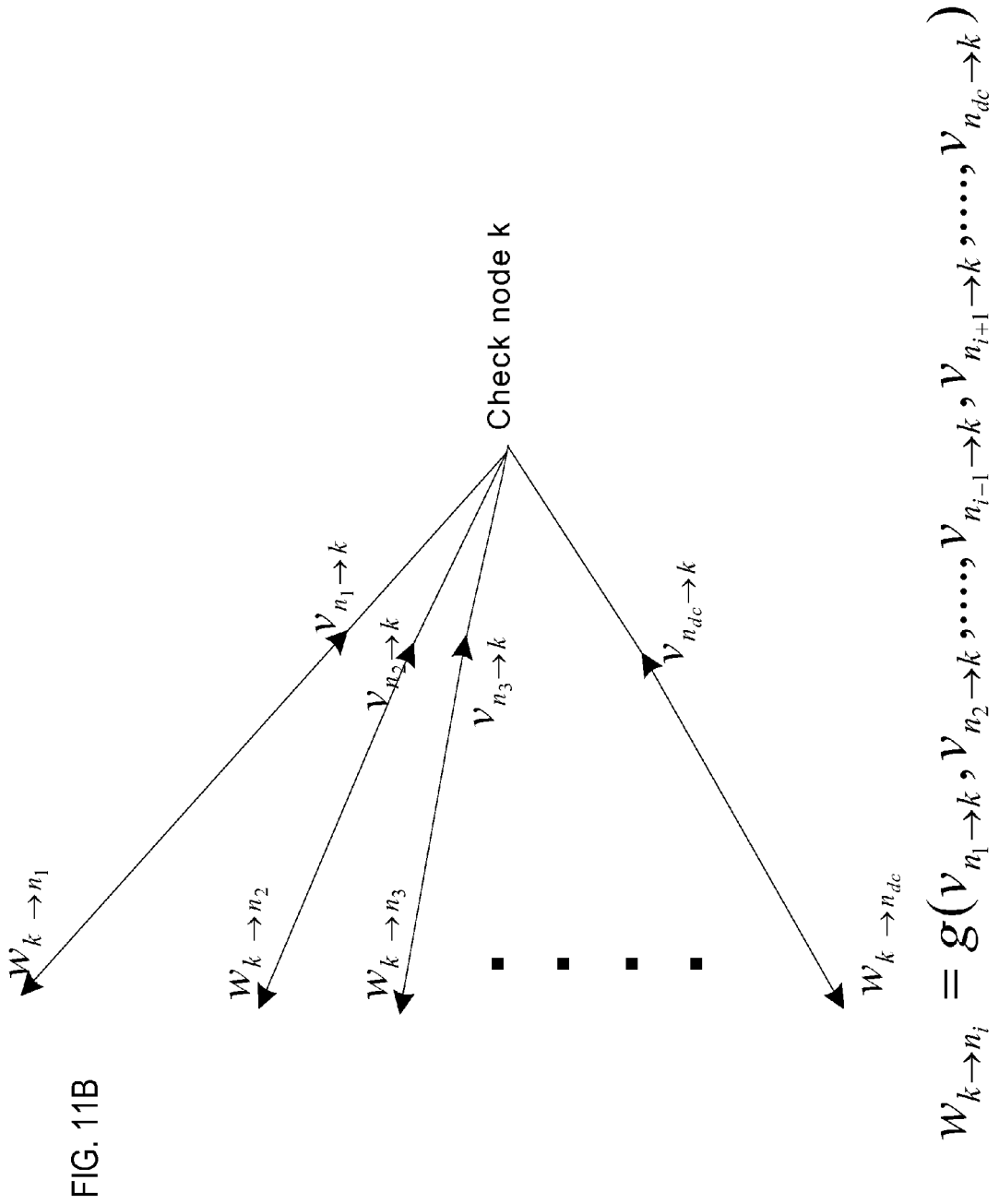
Figure 11C:
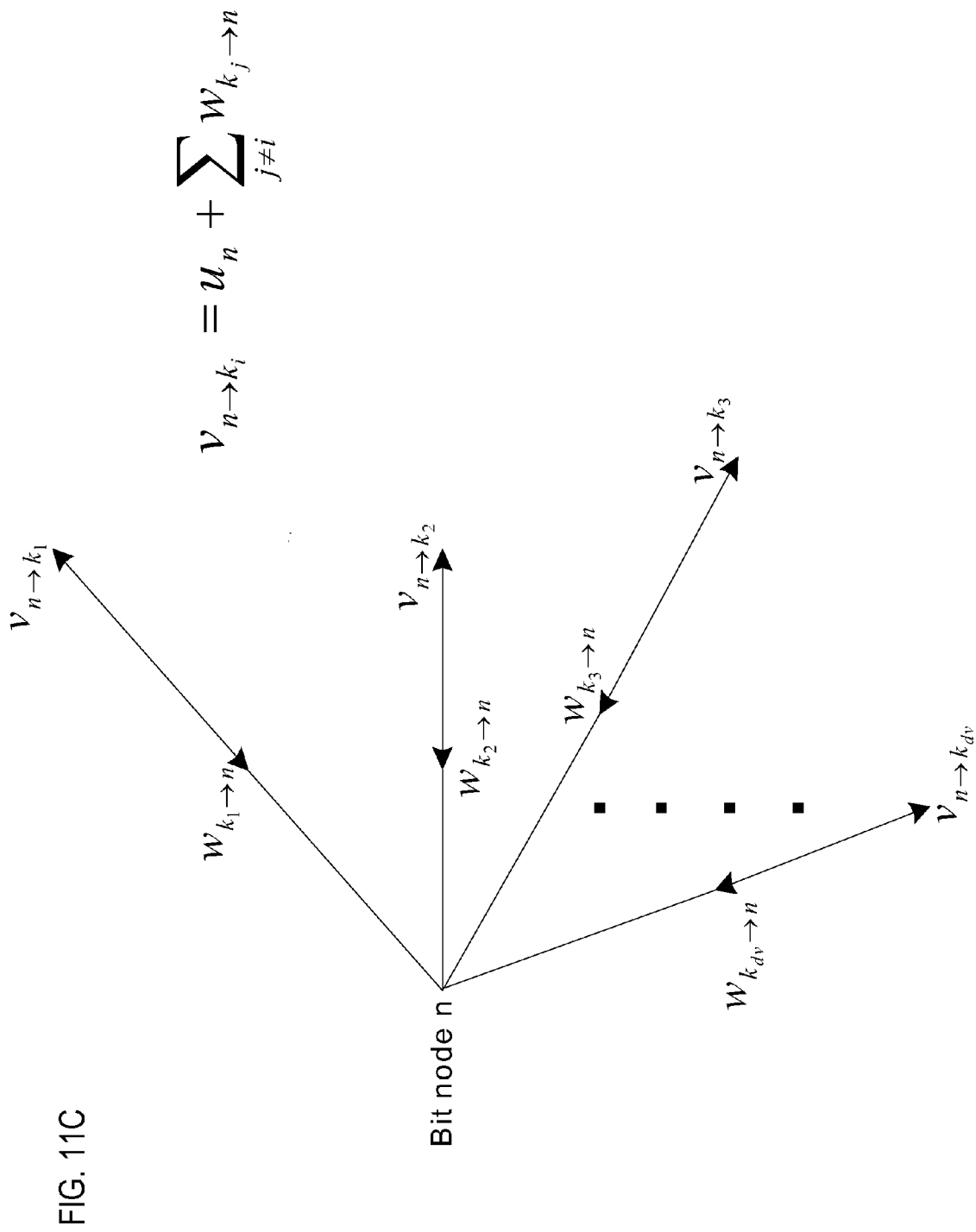

The process 1000 of FIG. 10 is discussed with respect to FIGS. 11A-11C, which are diagrams of interactions between the check nodes and the bit nodes in the decoding process, according to an exemplary embodiment. At step 1001, an initialization is performed. In an exemplary embodiment, the initialization of step 1001 is carried out before the first LDPC decoder iteration only. The initialization, as further illustrated in FIG. 11A, is achieved by assigning a-priori log-likelihood information of every transmitted bit to all of the outgoing edges of the corresponding bit node, as follows.

$$v_{n\to k_i}=u_n, \quad n=0,1,\ldots,N-1, \quad i=1,2,\ldots,\deg(\text{bit node } n)$$

Here, $v_{n\to k_i}$ denotes the message that goes from bit node n to its adjacent check node $k_i$, $u_n$ denotes the a-priori log-likelihood for the bit n, and N is the codeword size.

At step 1003 a check node, for example, check node k, is updated, whereby the input v yields the output w. As illustrated in FIG. 11B, incoming messages to the check node k from its $d_c$ adjacent bit nodes are denoted by $v_{n_1\to k}, v_{n_2\to k}, \ldots, v_{n_{dc}\to k}$. The goal is to compute the outgoing messages from the check node k back to $d_c$ adjacent bit nodes. These messages are denoted by $w_{k\to n_1}, w_{k\to n_2}, \ldots, w_{k\to n_{dc}}$, as is computed as follows.

$$w_{k\to n_i}=g(v_{n_1\to k}, v_{n_2\to k}, \ldots, v_{n_{i-1}\to k}, v_{n_{i+1}\to k}, \ldots, v_{n_{dc}\to k})$$

where, $$g(a,b)=\text{sign}(a)\times\text{sign}(b)\times\{\min(|a|,|b|)\}+\text{LUT}_g(a,b)$$

$$\text{LUT}_g(a,b)=\log(1+e^{-|a+b|})-\log(1+e^{-|a-b|})$$

In practice, $\text{LUT}_g(.)$ function is implemented using a small look up table. Also it can be shown that the $g(.)$ function with multiple inputs can be recursively computed, i.e., $$g(v_{n_1\to k}, v_{n_2\to k}, \ldots, v_{n_{i-1}\to k}, v_{n_{i+1}\to k}, \ldots, v_{n_{dc}\to k})=$$

$$g(g(v_{n_1\to k}, v_{n_2\to k}, \ldots, v_{n_{i-1}\to k}, v_{n_{i+1}\to k}, \ldots, v_{n_{dc-1}\to k}), v_{n_{dc}\to k})$$

In an exemplary embodiment, for LDPC codes that are applied to the SCMA system of FIGS. 1A and 1B, check node degrees are either 2 or 3. This can greatly simplify the check node arithmetic as follows:

When check node degree is two:

$$w_{k\to n_1}=v_{n_2\to k}$$

$$w_{k\to n_2}=v_{n_1\to k}$$

When check node degree is three:

$$w_{k\to n_2}=g(v_{n_1\to k}, v_{n_3\to k})$$

$$w_{k\to n_3}=g(v_{n_1\to k}, v_{n_2\to k})$$

At steps 1005 and 1007, a bit node, for example, bit node n, is updated and the a posteriori probability information is outputted. The incoming messages to the bit node n from its $d_v$ adjacent check nodes can be denoted by $w_{k_1\to n}, w_{k_2\to n}, \ldots, w_{k_{dv}\to n}$, as illustrated in FIG. 11C. The goal is to compute the outgoing messages from the bit node n back to $d_v$ adjacent check nodes. The outgoing messages can be denoted by $v_{n\to k_1}, v_{n\to k_2}, \ldots, v_{n\to k_{dv}}$ and can be computed as follows.

$$v_{n\to k_i}=u_n+\sum_{j\ne i}w_{k_j\to n}$$

Also, a posteriori probability information is outputted as $$a_{n_i} = u_n + \sum_j w_{k_j \to n} \quad n = 0, 1, 2 \ldots, N-1$$

At step 1009 it is determined whether all parity check equations are satisfied. In one exemplary embodiment, hard decision can be made based on the sign of $a_{n_i}$. If the parity check equations are not satisfied, steps 1003-1007 are repeated; otherwise the hard decision is outputted. In one exemplary embodiment, the hard decision can be expressed as follows.

$$\hat{c}_n = \begin{cases} 0, & a_n \geq 0 \\ 1, & a_n < 0 \end{cases} \quad \text{Stop if } H\hat{c}^T = 0$$

In the case that the parity check equations are not satisfied and steps 1003-1007 are repeated, if no convergence is achieved after pre-determined number of iterations, the current output is given out and a decoding failure can be declared.

Two general approaches exist to realize the interconnections between check nodes and bit nodes: (1) a fully parallel approach, and (2) a partially parallel approach. In fully parallel architecture, all of the nodes and their interconnections are physically implemented. The advantage of this architecture is speed.

The fully parallel architecture, however, may involve greater complexity in realizing all of the nodes and their connections. Therefore with fully parallel architecture, a smaller block size may be required to reduce the complexity. In that case, for the same clock frequency, a proportional reduction in throughput and some degradation in FER versus Es/No performance may result.

The second approach to implementing LDPC codes is to physically realize only a subset of the total number of the nodes and use only these limited number of "physical" nodes to process all of the "functional" nodes of the code. Even though the LDPC decoder operations can be made extremely simple and can be performed in parallel, the further challenge in the design is how the communication is established between "randomly" distributed bit nodes and check nodes. The decoder 307 (of FIG. 3), according to one embodiment of the present invention, addresses this problem by accessing memory in a structured way, as to realize a seemingly random code. This approach is explained with respect to FIGS. 12A and 12B.

Figure 12A:
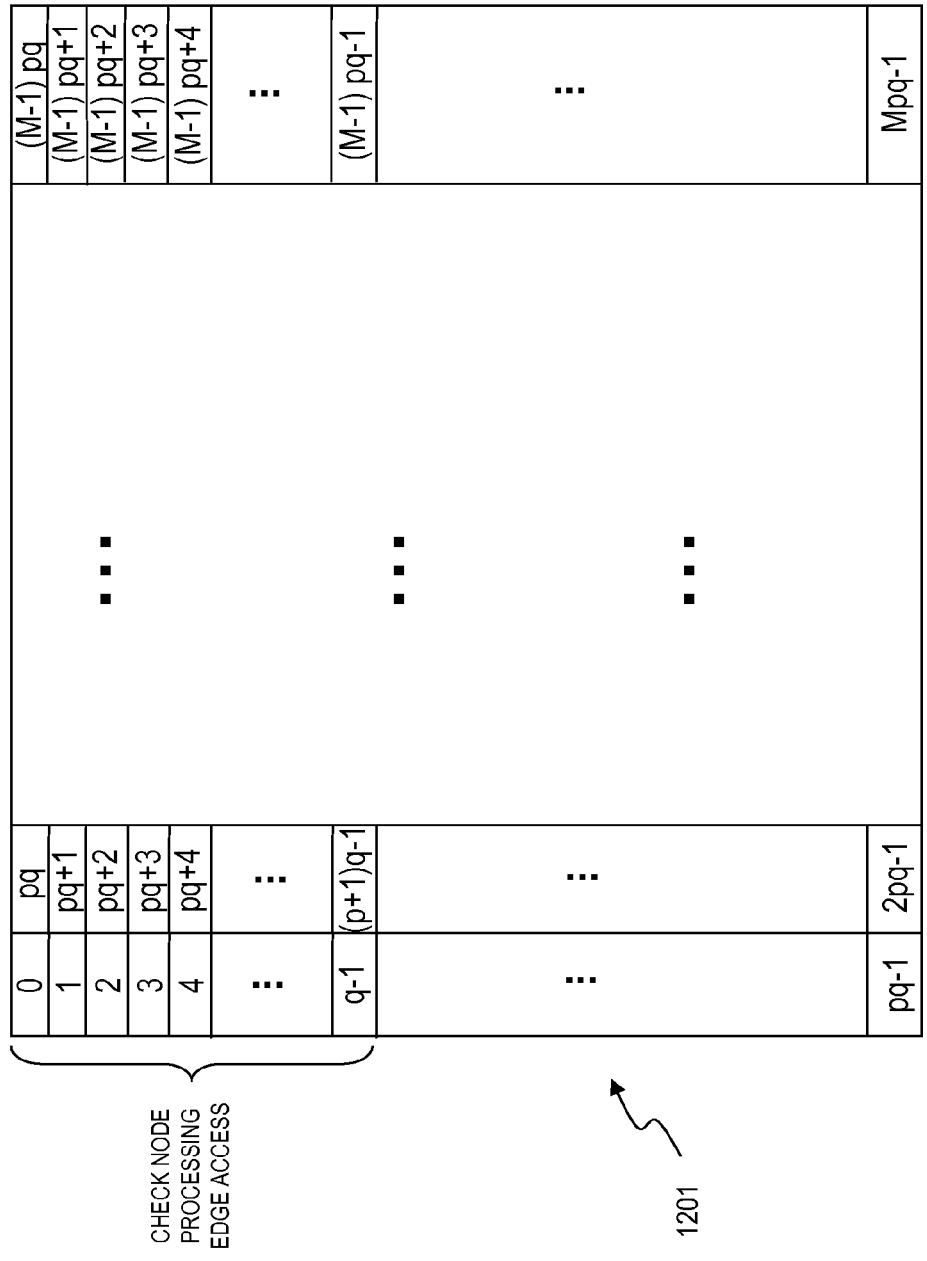
FIGS. 12A and 12B are diagrams of the top edge and bottom edge, respectively, of memory organized to support structured access as to realize randomness in LDPC coding, according to an exemplary embodiment.
Figure 12B:
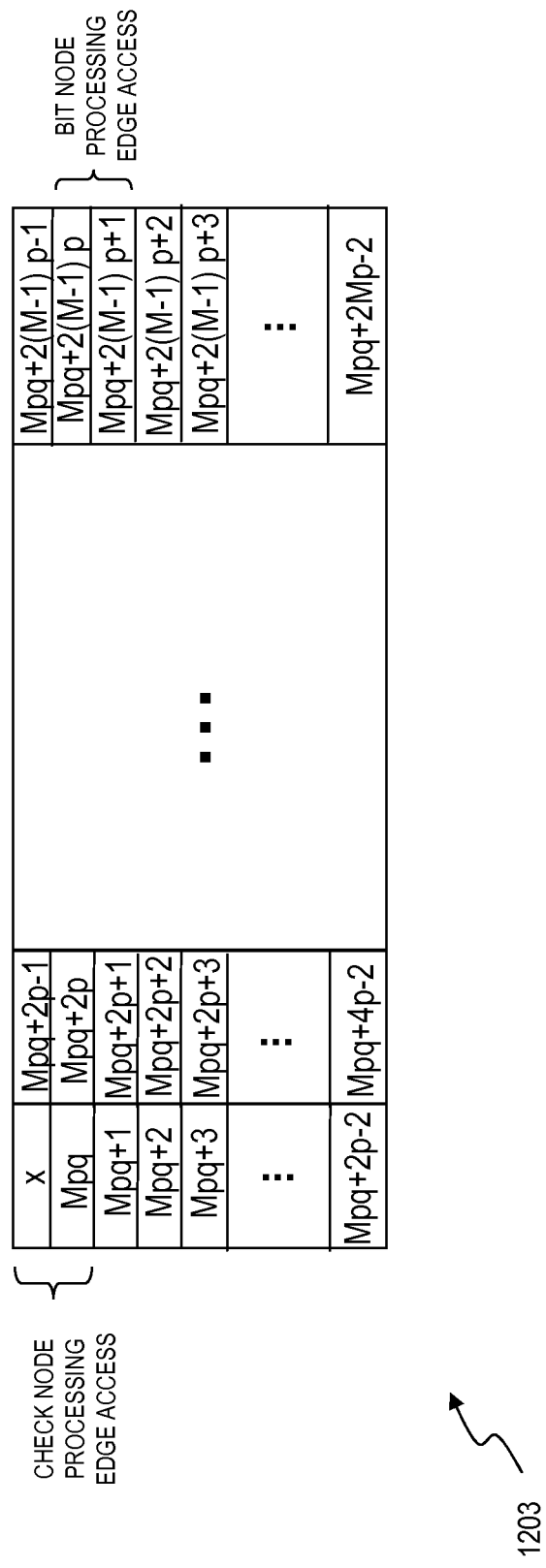

FIGS. 12A and 12B are diagrams of the top edge and bottom edge, respectively, of memory organized to support structured access as to realize randomness in LDPC coding, according to an exemplary embodiment. Structured access can be achieved without compromising the performance of a truly random code by focusing on the generation of the parity check matrix. In general, a parity check matrix can be specified by the connections of the check nodes with the bit nodes. For example, the bit nodes can be divided into groups of a fixed size, which for illustrative purposes is M. In one example, M is number of parallel computation engines. Additionally, assuming the check nodes connected to the first bit node of degree 3, for instance, are numbered as a, b and c, then the check nodes connected to the second bit node are numbered as a+p, b+p and c+p, the check nodes connected to the third bit node are numbered as a+2p, b+2p and c+2p etc.; where p=(number of check nodes)/M. For the next group of M bit nodes, the check nodes connected to the first bit node are different from a, b, c so that with a suitable choice of p, all the check nodes have the same degree. A random search can be performed over the free constants such that the resulting LDPC code is cycle-4 and cycle-6 free. According to one exemplary embodiment, because of the structural characteristics of the parity check matrix, the edge information can be stored to permit concurrent access to a group of relevant edge values during decoding.

In other words, the approach of the present invention facilitates memory access during check node and bit node processing. The values of the edges in the bipartite graph can be stored in a storage medium, such as random access memory (RAM). It is noted that for a truly random LDPC code during check node and bit node processing, the values of the edges would need to be accessed one by one in a random fashion. However, such a conventional access scheme would be too slow for a high data rate application. The RAM of FIGS. 12A and 12B are organized in a manner, whereby a large group of relevant edges can be fetched in one clock cycle; accordingly, these values are placed "together" in memory, according to a predetermined scheme or arrangement. It is observed that, in actuality, even with a truly random code, for a group of check nodes (and respectively bit nodes), the relevant edges can be placed next to one another in RAM, but then the relevant edges adjacent to a group of bit nodes (respectively check nodes) will be randomly scattered in RAM. Therefore, the "togetherness," under the present invention, stems from the design of the parity check matrices themselves. That is, the check matrix design ensures that the relevant edges for a group of bit nodes and check nodes are simultaneously placed together in RAM.

As illustrated in FIGS. 12A and 12B, each box contains the value of an edge, which is multiple bits (e.g., 8 bits). Edge RAM, according to an exemplary embodiment, is conceptually divided into two parts, top edge RAM 1201 (FIG. 12A) and bottom edge RAM 1203 (FIG. 12B). Bottom edge RAM 1203 contains the edges between parity bit nodes of degree 2, for instance, (or 1 for one single bit node) and check nodes. Top edge RAM 1201 contains the edges between information bit nodes and check nodes. Therefore, according to an exemplary embodiment, for every check node, 2 adjacent edges are stored in the bottom RAM 1203, and the rest of the edges are stored in the top edge RAM 1201. The size of the top edge RAM 1201 and bottom edge RAM 1203 for various code rates are given in Table 6.

TABLE 6

|  | 1/9 | 1/15 |
| --- | --- | --- |
| Top Edge RAM | 16 × 50 | 8 × 100 |
| Bottom Edge RAM | 128 × 50 | 112 × 100 |

In an exemplary embodiment, a group of M bit nodes and M check nodes is processed at a time. In this embodiment, M is equal to the number of columns in Table 6. According to another exemplary embodiment, for M check node processing, $q=d_c-2$ consecutive rows from top edge RAM 1201 and 2 consecutive rows from bottom edge RAM 1203 is accessed, which the value of $d_c$ can depend on the code rate. This exemplary embodiment can be employed in digital video broadcasting—satellite—second generation (DVB-S2) and/or DSL+.

For bit node processing, if the group of M bit nodes are parity bit nodes, their edges are located in 2 consecutive rows of the bottom edge RAM 1203. If the bit nodes are information bit nodes with degree $d_v$, their edges are located in some $d_v$ rows of the top edge RAM 1201. The address of these $d_v$ rows can be stored in non-volatile memory, such as Read-Only Memory (ROM). The edges in one of the rows correspond to the first edges of M bit nodes, the edges in another row correspond to the second edges of M bit nodes, etc. Moreover for each row, the column index of the edge that belongs to the first bit node in the group of M can also be stored in ROM. The edges that correspond to the second, third, etc. bit nodes follow the starting column index in a "wrapped around" fashion. For example, if the $j^{th}$ edge in the row belongs to the first bit node, then the (j+1)st edge belongs to the second bit node, (j+2)nd edge belongs to the third bit node, . . . , and (j−1)st edge belongs to the $M^{th}$ bit node.

With the organization shown in FIGS. 12A and 12B, speed of memory access is greatly enhanced during LDPC coding.

Tables 7 and 8 specify the row index and the starting column index of top edge RAM 1201 for every group of M information bit nodes, according to an exemplary embodiment. Each row in the tables represents a group of M bit nodes. The first number denotes the row index and the second number denotes the starting column index. For example in Table 6, the first row can determine the addresses of adjacent edges for the first group of 50 information bit nodes of degree 2. More precisely the entry 9/21 means that one adjacent edge per bit node for all of the 50 bit nodes are stored in row number 9. Moreover in that row, the column indexed 21 carries the information for the adjacent edge of the first bit node, column indexed 22 carries the information for the adjacent edge of the second bit node, etc., and finally column indexed 20 carries the information for the adjacent edge of the $50^{th}$ bit node. Similarly the entry 14/42 means that another adjacent edge for all of the 50 bit nodes are stored in row number 14. Moreover in that row, the column indexed 42 carries the information for the adjacent edge of the first bit node, column indexed 43 carries the information for the adjacent edge of the second bit node, etc., and finally column indexed 41 carries the information for the adjacent edge of the $50^{th}$ bit node. In exactly the same manner, the entries in the second row of Table 7 can determine the addresses of the adjacent edges for the second group of 50 bit nodes, etc.

TABLE 7

Row Index/Starting Column Index (Rate 1/9 N = 3600) (Decoder)

9/21 14/42
3/5 10/46
8/43 0/41
7/1 5/9
13/2 2/18
4/7 6/25
15/39 11/24
1/11 12/15

TABLE 8

Row Index/Starting Column Index (Rate 1/15 N = 6000) (Decoder)

4/85 0/81
7/50 6/40
2/31 5/52
3/21 1/74

FIGS. 13A-13D are diagrams of parity check matrix, bipartite graph, top edge RAM, and bottom edge RAM, respectively, to support structured access as to realize randomness in LDPC coding, according to an exemplary embodiment. This exemplary LDPC coding can be employed for DVB-S2 and DSL+ codes for a rate of ⅔ and code length of N=18.

Figure 13A:
Figure 13B:
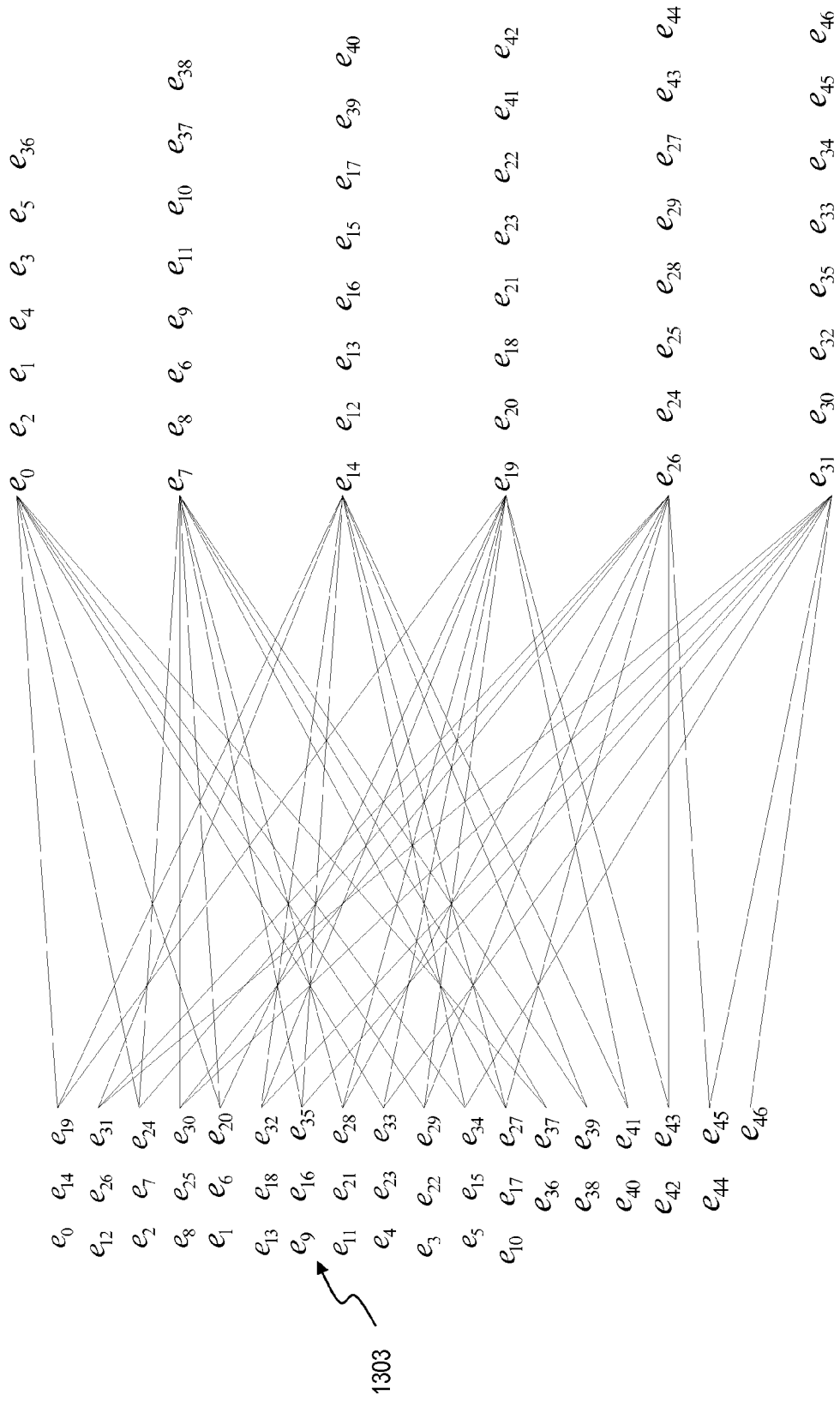

FIG. 13A illustrates a sparse parity check matrix 1301 of an LDPC code, according to an exemplary embodiment and FIG. 13B illustrates the corresponding bipartite graph 1303 of the LDPC code of the matrix 1301. In this exemplary embodiment, all but one check node has degree $d_c$=8 and M=3 nodes are processed in parallel. The arrangement of top edge RAM 1305 is illustrated in FIG. 13C and the arrangement of bottom edge RAM 1307 is illustrated in FIG. 13D.

In this exemplary embodiment, check nodes are partitioned into groups of M=3 {0,2,4} and {1,3,5}. There is no need to store the groups since the computation engines do not care which nodes are processed. For the first group, $d_c$−2=6 adjacent edges are $e_0\ e_1\ e_2\ e_3\ e_4\ e_5, e_{12}\ e_{13}\ e_{14}\ e_{15}\ e_{16}\ e_{17}, e_{24}\ e_{25}\ e_{26}\ e_{27}\ e_{28}\ e_{29}$. All the above edges are stored in the first 6 rows of top edge RAM 1305. Therefore, it is only needed that those 6 rows be fetched. Moreover, in each row the $j^{th}$ element belongs to the $j^{th}$ check node in the group. The remaining adjacent edges are $e_{36}\ e_{39}\ e_{40}\ e_{43}\ e_{44}$. These remaining edges are stored in the first two rows of bottom edge RAM 1307. Similar to top edge RAM 1305 case, in each row, the $j^{th}$ element belongs to the $j^{th}$ check node in the group. Similar structure exists for the other group of check nodes. Therefore, as far as check node processing is concerned, there is no need for any ROM storage. Simply, consecutive rows of edge RAM's are accessed and within each row, it is known exactly where to find the edge for a particular check node in the group.

Also, bit nodes of degree $d_v$>2 are partitioned into groups of M=3: {0,1,2}, {3,4,5}, {6,7,8}, {9,10,11}. Bit nodes in the first group have degree 3 and their adjacent edges are $e_0\ e_{14}\ e_{19}, e_{12}\ e_{26}\ e_{31}, e_2\ e_7\ e_{24}$. All these edges can appear in top edge RAM 1305, namely rows indexed 0, 2 and 7. These row indices can be stored in ROM. Row 0 carries $e_0\ e_{12}\ e_{24}$; row 2 carries $e_2\ e_{14}\ e_{26}$; and row 7 carries $e_7\ e_{19}\ e_{31}$. Similar to the check node case, each row carries one adjacent edge per bit node. On the other hand they might not be in perfect order as in the case of check nodes. In other words the $j^{th}$ element in each row does not necessarily belong to the $j^{th}$ node. However, as it was explained before, if the $j^{th}$ element belongs to the first bit node, then (j+1)$^{st}$ element belongs to the second bit, (j+2)$^{nd}$ element belongs to the third bit node. etc., and finally (j−1)$^{st}$ element belongs to the $M^{th}$ bit node (in a barrel shifted manner). Therefore, all needed to be stored in ROM is the index j of each row that belongs to the first bit node in the group. In this example, it can be noticed that for row indexed 0, $e_0$ belongs to the first bit node (hence j=0); for row indexed 2, $e_{14}$ belongs to the first bit node (hence j=1) and for row indexed 7, $e_{19}$ belongs to the first bit node (hence j=1). Therefore, the first part of our ROM table reads 0/0 2/1 7/1. Going through the other groups in a similar manner, following ROM table can be obtained

0/0 2/1 7/1
1/2 6/2 8/0
4/1 9/0 11/2
3/0 5/2 10/1

Following with this example, bit nodes of degree $d_v$=2 can be divided into the following groups: {12, 14, 16}, {13, 15, 17}. It can be verified that adjacent edges of each group occur in two consecutive rows of bottom edge RAM 1307 and moreover, in each row the $j^{th}$ element belongs to the $j^{th}$ bit node in the group (except for the last group where $j^{th}$ element of the bottom row and (j+1)mod M element of the top row belong to the same bit node). Therefore, for this case too, there is no need for ROM storage.

FIGS. 14A-14D are diagrams of parity check matrix, bipartite graph, top edge RAM, and bottom edge RAM, respectively, to support structured access as to realize randomness in LDPC coding, according to another exemplary embodiment. This exemplary LDPC coding can be employed in the SCMA system of FIGS. 1A and 1B for an exemplary rate of 1/9 and code length of N=18.

FIG. 14A illustrates a sparse parity check matrix 1401 of an LDPC code, according to an exemplary embodiment and FIG. 14B illustrates the corresponding bipartite graph 1403 of the LDPC code of the matrix 1401. In this exemplary embodiment, for the $n^{th}$ check node, the degree is 3, if n mod 8=0, 2 or 5, otherwise, the degree is 2 (exception: degree is 2 for n=0) and M=2 nodes are processed in parallel. The arrangement of top edge RAM 1405 is illustrated in FIG. 14C and the arrangement of bottom edge RAM 1407 is illustrated in FIG. 14D.

In this example, check nodes are partitioned into groups of M=2, {0,8}, {1,9}, {2,10}, {3,11}, {4,12}, {5,13}, {6,14}, and {7,15}. There is no need to store the groups since the computation engines do not care which nodes are processed. Therefore, check nodes 0 and 8 are processed together, check nodes 1 and 9 are processed together, etc. Groups {0,8}, {2,10} and {5,13} have one more edge in top edge RAM 1405. For the first group of {0,8}, those adjacent edges are $e_0$ and $e_3$ and they are stored in the first row of top edge RAM 1405. Therefore, only that one row needs to be fetched. Moreover, in each row, the $j^{th}$ element belongs to the $j^{th}$ check node in the group. The remaining adjacent edges are $e_6$ $e_{21}$ $e_{22}$, which are stored in the first two rows of bottom edge RAM 1407. Similar to top edge RAM 1405 case, in each row the $j^{th}$ element belongs to the $j^{th}$ check node in the group. For the next group of check nodes {1,9}, all the adjacent edges are in the bottom edge RAM 1407, namely third and forth row. Similar structure exists for the other group of check nodes. Therefore, as far as check node processing is concerned, there is no need for any ROM storage. Simply, consecutive rows of edge RAM's are accessed and within each row, it is known exactly where to find the edge for a particular check node in the group.

Bit nodes of degree $d_v > 2$ are partitioned into groups of M=2. In this example, there is only one group: {0,1}. They have degree 3 and their adjacent edges are $e_0$ $e_1$ $e_5$, $e_2$ $e_3$ $e_4$. These edges can appear in top edge RAM 1405, namely rows indexed 0, 1, and 2. These row indices are stored in ROM. Row 0 carries $e_0$ $e_3$; row 1 carries $e_1$ $e_4$; row 2 carries $e_2$ $e_5$. Similar to the check node case, each row carries one adjacent edge per bit node. On the other hand they are not in perfect order as in the case of check nodes. In other words the $j^{th}$ element in each row does not necessarily belong to the $j^{th}$ node. However, as noted above, if the $j^{th}$ element belongs to the first bit node, then $(j+1)^{st}$ element belongs to the second bit, $(j+2)^{nd}$ element belongs to the third bit node etc. and finally $(j-1)^{st}$ element belongs to the $M^{th}$ bit node (in a barrel shifted manner). Therefore, all needed to be stored in ROM is the index j of each row that belongs to the first bit node in the group. In the above example, for row indexed 0, $e_0$ belongs to the first bit node (hence j=0); for row indexed 1, $e_1$ belongs to the first bit node (hence j=0), and for row indexed 2, $e_5$ belongs to the first bit node (hence j=1). Therefore the ROM table reads 0/0 1/0 2/1.

Bit nodes of degree $d_v = 2$ can be divided into the following groups: {2,10}, {3,11}, {4,12}, {5,13}, {6,14}, {7,15}, {8,16}, and {9,17}. It can be verified that adjacent edges of each group occur in two consecutive rows of bottom edge RAM 1407 and moreover, in each row the $j^{th}$ element belongs to the $j^{th}$ bit node in the group (except for the last group where $j^{th}$ element of the bottom row and (j+1)mod M element of the top row belong to the same bit node). Therefore for this case too, there is no need for ROM storage.

According to certain embodiments, a scrambled coded multiple access (SSCMA) scheme is utilized. The exemplary embodiments discussed below can employ various coding schemes such as low rate turbo codes, low density parity check (LDPC) codes (for instance, LDPC codes discussed earlier), etc.

Figure 15:
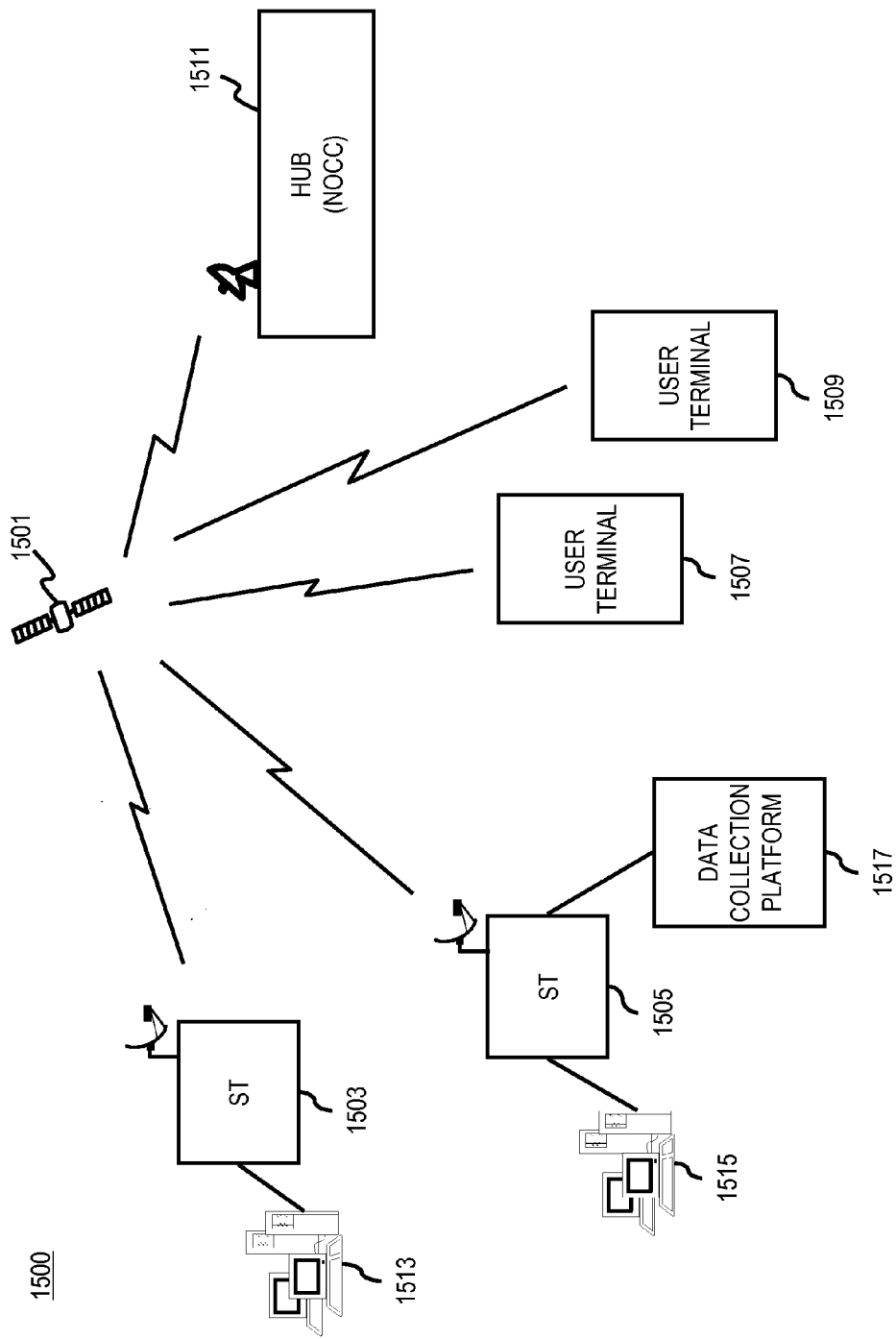
FIG. 15 is a communications system capable of providing a spread scrambled division multiple access (SSDMA) scheme, according to various exemplary embodiments.

FIG. 15, along with FIGS. 1A and 1B, are communications systems capable of providing a spread scrambled coded multiple access (SSCMA) scheme, according to various exemplary embodiments. According to certain embodiments, communication system 1500 of FIG. 15, which is capable of providing the SSCMA scheme, may be configured to support low power, long battery-life, and low duty-factor user terminals, data collection platforms, and/or supervisory control and data acquisition (SCADA) services. A variety of services may be provided by communication system 1500 that can include, but not limited to, (a) monitoring and reporting of utility meter readings for electricity, oil, gas, and/or chemical storage tanks; (b) monitoring and reporting of flow, temperature, pressure, leakage, corrosion, and/or cathodic protection for oil and gas pipelines; (c) monitoring and control of remote voltage regulators, capacitors, valves, compressors, and/or substations for chemical plants; (d) monitoring and tracking of vehicles, trucks, trailers, containers, cargos, barges, ships, trains, hazardous materials, and/or movements of special targets of interest (including personnel and wildlife); (e) diagnostic monitoring of the operating conditions of vehicles, tanker fleets, trailers, barges, and/or ships, including temperature alarms, open doors, full/empty conditions, engine hours, fuel levels, miles driven, and/or engine diagnostics, etc.; and (f) monitoring and reporting of meteorological and environmental data, including, but not limited to, air temperature, pressure, precipitation, and quality; water temperature, flow, and/or level; and readings of rain gauge, lightening and fire detectors, avalanche monitors, buoys, balloons, iceberg movements, etc.

Key characteristics of these types of services provided by communication system 1500 using SSCMA scheme can include low data rate (e.g., around 100s bps), low duty factor (a few times monthly, weekly, daily, and/or event driven), and geographically dispersed using unattended and battery operated user terminals. It is important to minimize cost and to maximize battery life of these user terminals as well as to maximize channel throughput in order to make these services economically viable.

Moreover, communication system 1500, by employing SSCMA scheme, can advantageously provide a frame for transmission of high speed data from user terminals to comply with any set requirements or regulations relating to, for example, mitigating off-axis EIRP density limit using, for example, spectral spreading of transmitted data. According to one exemplary embodiment, SSCMA can be employed for communication of user terminals over an existing C-, X-, Ku-, or Ka band transponder of a geosynchronous Fixed Service Satellite (FSS) satellite for, for example, satellite-on-the-move (SOTM) applications. Since significant amount of EIRP from terminals might be needed for uplink closure and user terminals can have small apertures, utilizing SSCMA scheme can moderate off-axis EIRP density to ensure no limits are exceed.

The SSCMA scheme employed by communication system 1500 can advantageously utilize scrambled coded multiple access scheme, low rate forward error correction (FEC) coding, and spectral spreading to achieve, at least, both power and bandwidth efficiency. Therefore, not only low power and long battery life user terminals can be used in providing viable data collection and SCADA services and channel throughput can be maximized, but also power density issues can be mitigated. In one exemplary embodiment, SSCMA scheme can be configured to spread the radiated power spectral density by a factor of F/R versus un-coded modulation waveform, where F is spreading factor and R is FEC code rate. Thus, if a low rate coding of R/F is used, whereby R is equal to 1/n, then the composite code rate would yield 1/(nF).

As noted, channel of system 1500 (such as channel 103 of system 100) can be a noise channel. To combat this noise channel, coding is utilized. For example, forward error correction (FEC) codes can be employed. Forward error correction (FEC) is required in terrestrial and satellite systems to provide high quality communication over a radio frequency (RF) propagation channel, which induces signal waveform and spectrum distortions, including signal attenuation (freespace propagation loss) and multi-path induced fading. These impairments drive the design of the radio transmission and receiver equipment; exemplary design objectives include selecting modulation formats, error control schemes, demodulation and decoding techniques and hardware components that together provide an efficient balance between system performance and implementation complexity. Differences in propagation channel characteristics, such as between terrestrial and satellite communication channels, can result in significantly different system designs. Likewise, existing communication systems continue to evolve in order to satisfy increased system requirements for new higher rate or higher fidelity communication services.

Code rate is an important factor that has a significant effect on the error performance of the code. The choice of which code rate to operate, in turn, depends on the SNR of the environment in which the codes will be deployed. Typically, low SNR environments require the use of low code rates (i.e., more redundancy), whereas high SNR environments can enable the utilization of higher code rates. Hence, there is a continual challenge to devise codes that edge closer to the theoretical bound (i.e., Shannon limit), while minimizing complexity.

In an exemplary embodiment, the communication system 1500 can use employ LDPC codes (such as LDPC codes discussed above) as the low rate coding scheme. Although certain embodiments are described with respect to LDPC codes, it is contemplated that these embodiments have applicability to low-rate codes in general (e.g., low-rate turbo codes).

Satellite communication system 1500 includes a satellite 1501 that supports communication among multiple satellite terminals (STs) 1503, 1505, user terminals (UTs) 1507, 1509, and hub 1511. The hub 1511 may assume the role of a Network Operations Control Center (NOCC), which controls the access of the terminals (such as STs and/or UTs 1503, 1505, 1507, and/or 1509) to the network 1500 and also provides element management functions and control of the address resolution and resource management functionality. The satellite 1501, in an exemplary embodiment, operates as a packet switch (e.g., at a data link layer) that provides direct unicast and multicast communication among the terminals (STs and/ or UTs) 1503, 1505, 1507, 1509 and the hub 1511. The STs 1503, 1505 may provide connectivity to one or more hosts 133 and 135, respectively.

According to an exemplary embodiment, one or more STs can support one or more data collection platforms and/or SCADA systems. As illustrated in the exemplary FIG. 1500, the ST 1505 can support the data collection platform 1517. Additionally or alternatively, the data collection platform 1517 can operate independently from the ST 1505. In certain embodiments, the terminals (STs and/or UTs 1503, 1505, 1507, and/or 1509) can be low power, long battery life, and low duty factor terminals, which can be geographically dispersed and can communicate based on low data rates and low duty factors. Further, the terminals (STs and/or UTs 1503, 1505, 1507, and/or 1509) can be fixed or mobile terminals. Also, the terminals (STs and/or UTs 1503, 1505, 1507, and/or 1509) may be transmit-only terminals and/or have full duplex capabilities. In one example, the terminals (STs and/or UTs 1503, 1505, 1507, and/or 1509) may have global navigation satellite system (GNSS) (e.g., global positioning system (GPS)) receiving capabilities. Data transmission for transmit-only terminals can be triggered by an event (e.g., an event detected at a sensor) and/or be pre-scheduled at initial install, for example, using GPS time. Also, data transmission for duplex terminals can be triggered by an event, can be scheduled by configuration, and/or be commanded by the hub 1511 on an as needed basis.

Figure 16A:
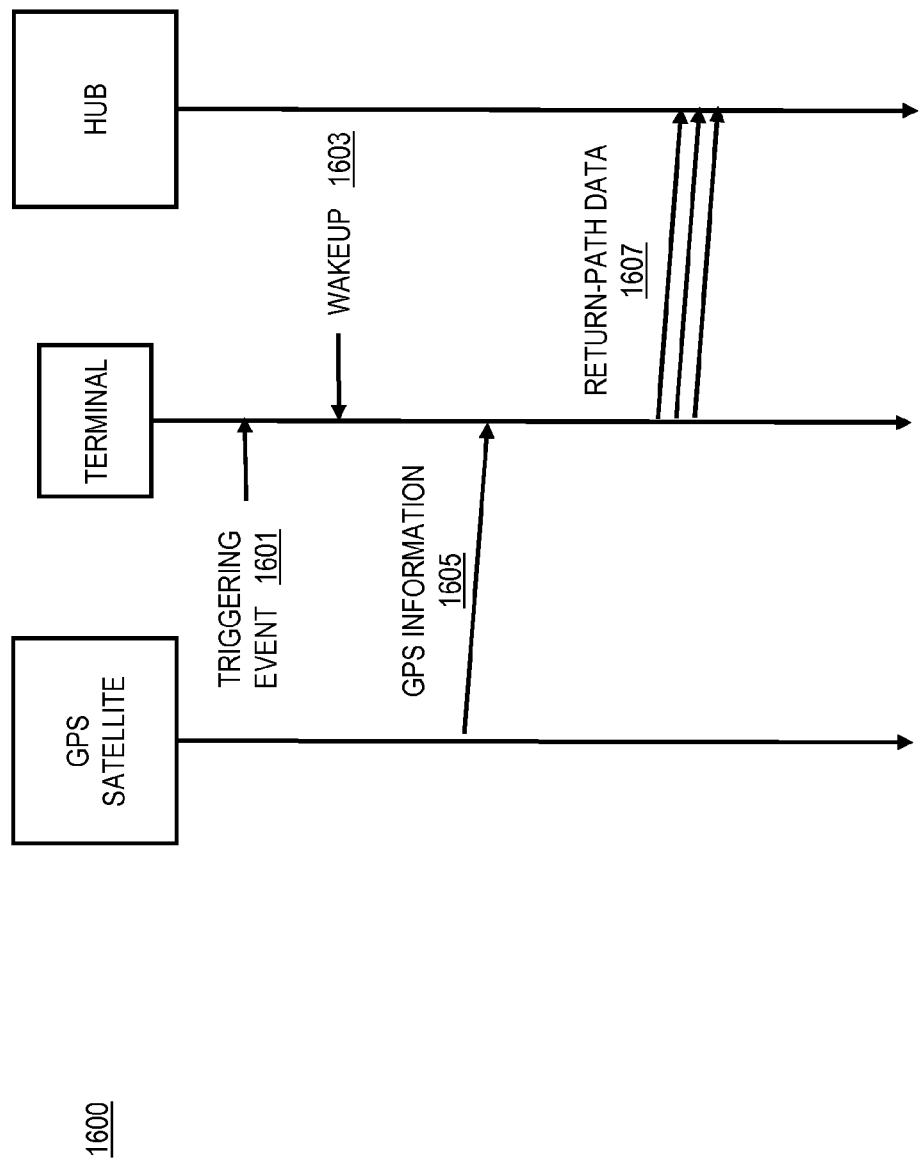
FIGS. 16A and 16B are ladder diagrams of processes for terminal data transmission, according to various exemplary embodiments.
Figure 16B:
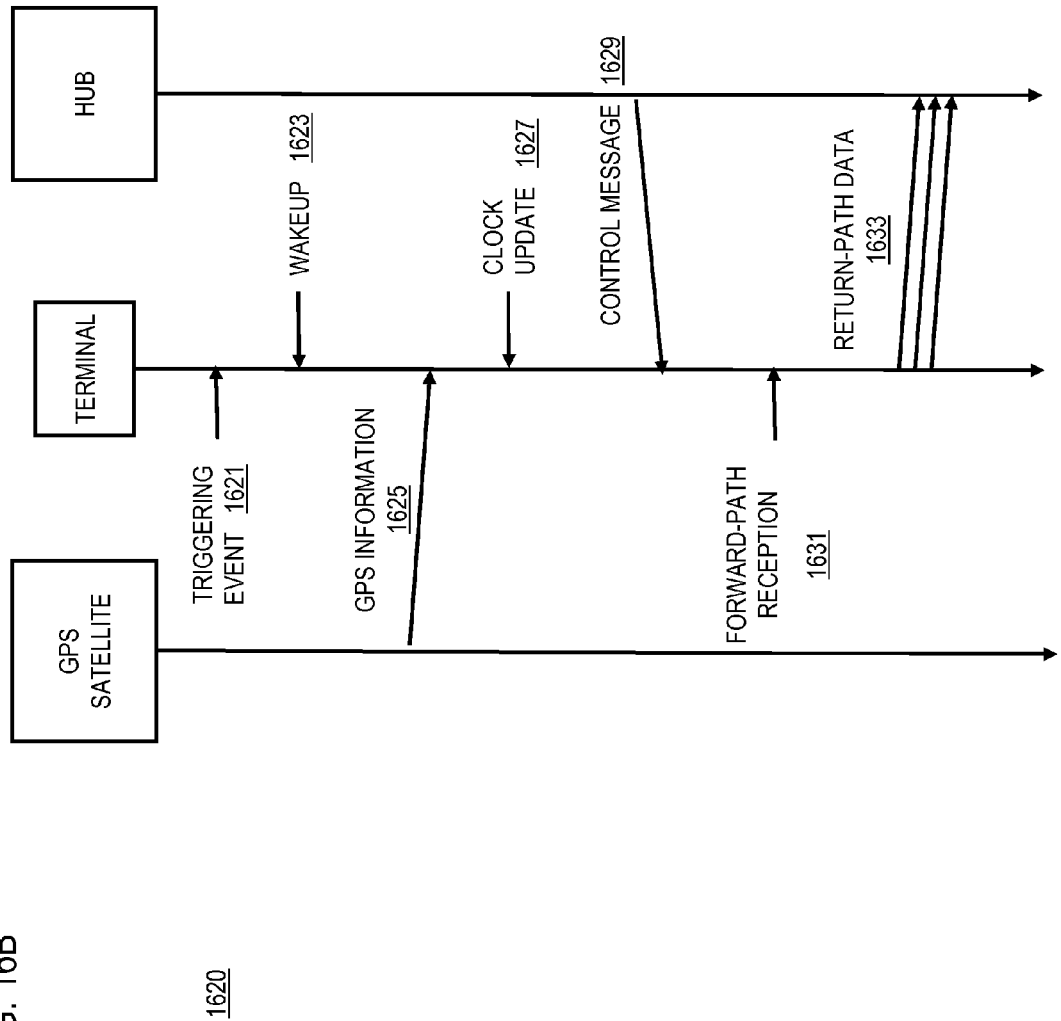

FIGS. 16A and 16B are ladder diagrams of processes for terminal data transmission, according to various exemplary embodiments. FIG. 16A illustrates concept of operation for a simplex terminal (such as one or more of ST and/or UT 1503, 1505, 1507, and/or 1509). In one exemplary embodiment, the terminal is in a sleep mode (or "inactive" state). A triggering event 1601 occurs. The triggering event can include, but not limited to, a triggering event generated by a sensor and/or an event pre-scheduled at initial install of the terminal. However, it is contemplated that other triggering events can be used. The terminal exits the sleep mode at step 1603 based on the triggering event 1601 and can receive the GPS information 1605 from a GPS satellite. As noted before, GPS satellite is used as an example, however, any global navigation satellite system can be employed. The terminal can use the received GPS information to, for example, discipline its oscillator(s), update its clock timing, warm up its electronics, etc. Further, the terminal can transmit its transmission data (such as sensor collected data) to, for example, hub 1511 through the satellite 1501 of FIG. 1B. In this exemplary embodiment, the communication path from the terminal (such as ST and/or UT 1503, 1505, 1507, and/or 1509) to hub 1511 through the satellite 1501 of FIG. 15 can be called the return path.

FIG. 16B illustrates concept of operation for a full duplex terminal (such as one or more of ST and/or UT 1503, 1505, 1507, and/or 1509). As noted, in an exemplary embodiment, the terminal can be in sleep mode. A triggering event 1621 can occur and the terminal can transition out from the sleep mode 1623. Further, the terminal receives GPS information 1625 from the GPS satellite and updates its clock, oscillator(s), etc. 1627. The duplex terminal can receive control message(s) 1629 from, for example, hub 1511 through satellite 1501 of FIG. 15. In one exemplary embodiment, control message(s) 1629 can include configuration information, including network configuration, network service provider (NSP) configuration, software configuration, user configuration, etc. The terminal can perform forward path reception including, but not limited to, Doppler tracking, phase and timing synchronization, demodulation, decoding, etc. Forward path can include communication path from, for example, hub 1511 of FIG. 16B to the terminal through satellite 1501.

After the control message(s) is received from, for example, hub 1511 and the forward path reception 1631 is performed, the terminal can transmit its transmission data (such as sensor collected data) to, for example, hub 1511.

Figure 17:
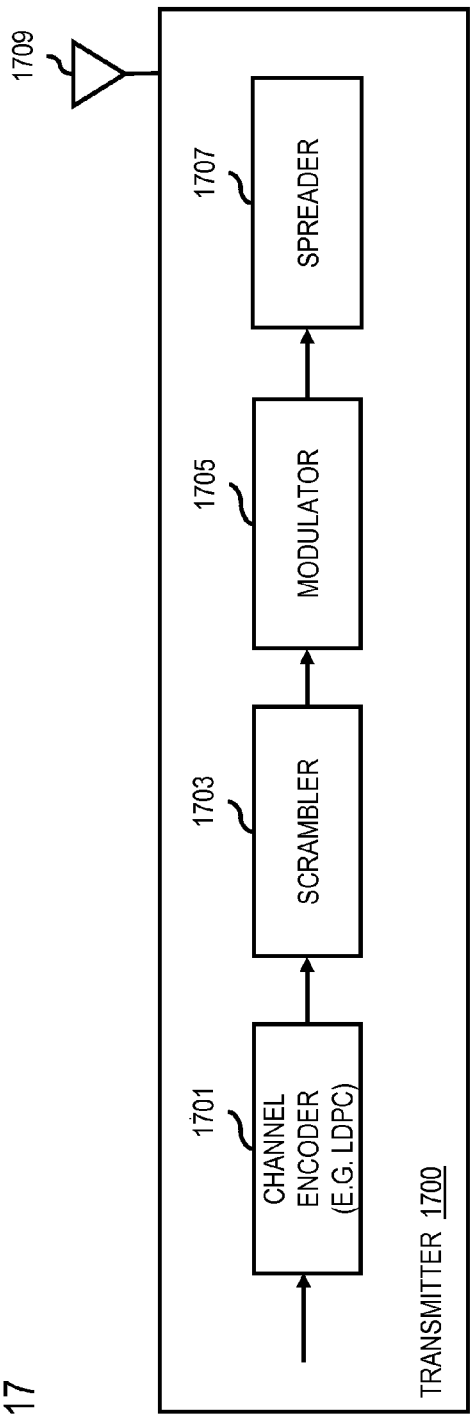
FIG. 17 is a diagram of a transmitter configured to operate in the systems of FIG. 15, according to an exemplary embodiment.

FIG. 17 is a diagram of a transmitter, according to an exemplary embodiment, configured to operate in the system of FIG. 15. In one exemplary embodiment, transmitter 1700 can be employed in a terminal (such as ST and/or UT 1503, 1505, 1507, and/or 1509). As noted, one key driver for success of data collection and/or SCADA services is hinged upon availability of terminals that are low cost and have long battery life.

Figure 18:
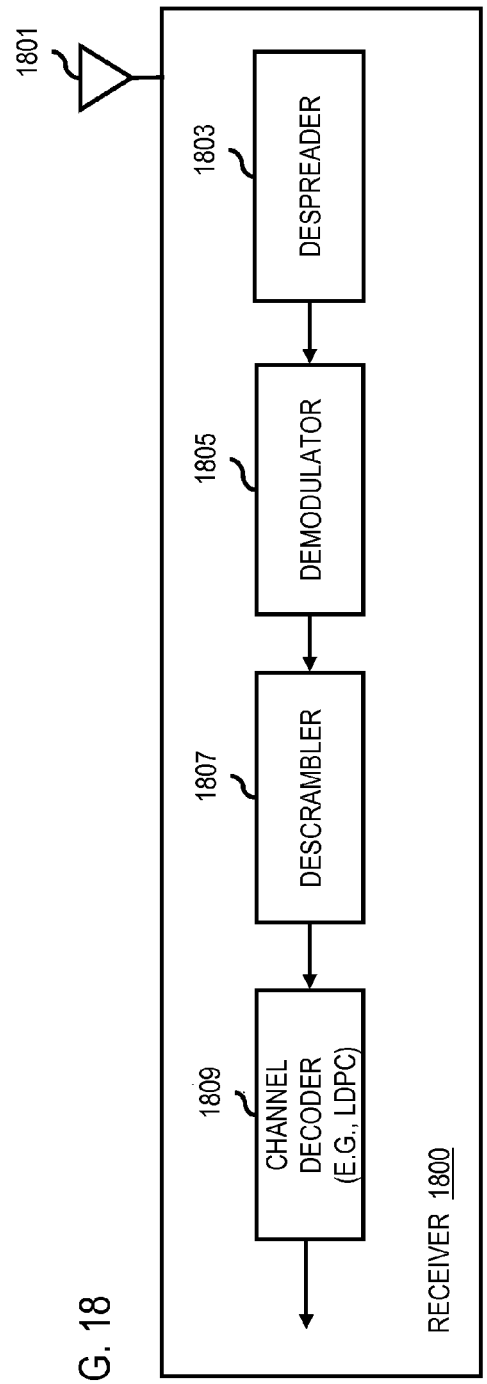
FIG. 18 is a diagram of a receiver configured to operate in the systems of FIG. 15, according to an exemplary embodiment.

As seen in FIG. 17, a transmitter 1700 can be equipped with a channel encoder (e.g., LDPC, turbo encoder, etc.) 1701 that accepts input from an information source and outputs coded stream of higher redundancy suitable for error correction processing at the receiver (as shown in FIG. 18). The information source generates k signals from a discrete alphabet, X. The channel encoder 1701 may utilize a low rate encoding scheme. LDPC codes and/or Low rate turbo codes can be used to minimize required energy-per-information bit over noise density (Eb/No) for achieving a desired packet error rate (PER). According to certain embodiments, the encoder 1701 can use LDPC encoding schemes as discussed earlier, for example, in accordance with encoder 201 of FIG. 2.

Essentially, the encoder 1701 generates signals from alphabet Y to a channel scrambler 1703, which scrambles the alphabet. That is, the channel scrambler 1703 pseudo-randomizes the code symbols. Terminals (and/or users of the terminals) can be distinguished by their distinct scrambler patterns. The scrambled signals are fed to a modulator 1705, which maps the encoded messages from encoder 1701 to modulated signal waveforms that are fed to a spreader 1707. In one exemplary embodiment, constant envelope Quadrature Phase Shift Keying (QPSK) modulation can be used that can allow saturation radio frequency amplification without loosing power efficiency. However, it is contemplated that other modulation schemes can also be employed by the modulator 1705.

The spreader 1707 can match the modulated signal waveforms to a given channel bandwidth by spectral spreading by a factor of F (e.g., F=4, 16, etc.). According to certain embodiments, the spreader 1707 expands the modulated signal waveform to match a channel bandwidth of 31.25×kHz. The spread modulated signal waveform is further transmitted to a transmit antenna 1707.

The spreader 1707 can employ spread spectrum techniques in order to spread, in frequency domain, energy and/or power generated in a particular bandwidth to result a signal with a wider bandwidth. Spectral spreading can result in limiting power flux density, a secure communication link, preventing detection, resistance to interference and/or jamming, etc. Spreader 1707 can employ frequency hopping, direct sequence, or a hybrid of these to spread the modulated signal waveform. However, other spreading techniques such as time-hopping spread spectrum (THSS) and/or chirp spread spectrum (CSS) can be employed.

The antenna 1709 emits these waveforms over the communication channel (such as communication channel 103 of FIG. 1A). Accordingly, the encoded messages are scrambled, modulated, spread, and distributed to a transmit antenna 1709. The transmissions from the transmit antenna 1709 propagate to a receiver, as discussed with respect to FIG. 18.

In addition to the above-noted components, transmitter 1700 can include additional modules. For example, transmitter 1700 can insert properly designed unique words (UW) symbols and pilot symbols to ensure burst synchronization at low energy per chip over noise density (Ec/No). Therefore, the transmitted signals can be distinguished based on their distinct scrambler patterns and UW symbols. UW symbols can be employed to facilitate burst and symbol timing synchronization. Also, pilot symbols, which can be inserted evenly across a packet payload, can be employed to assist carrier phase synchronization under low available Eb/No. In one exemplary embodiment, associated with the spreading factor F, a factor of F longer UW symbol in terms of chips may be used in order to provide sufficient signal to noise for UW detection. Also, additional electronic serial number (SEN) can be included in the transmitted signal for identification purposes. (Specific UW symbols of good auto and cross correlation properties can be generated by using the method proposed by A. Roger Hammons, Jr. and P. Vijay Kumar, "On a Recent 4-Phase Sequence Design for CDMA," IEEE Trans. on Comm. Vol. E76-B, No. 8, August 1993, pp. 804-813, which is incorporated in its entirety).

According to one exemplary embodiment, hub 1511 of FIG. 15 can transmit waveform signals (that can include, for example, SCADA signal) over each beam at the same frequency channel (for example 31.25×kHz channel) for duplex terminals. This can eliminate requirement of having frequency synthesizer in each terminal. Individual burst can be employed for different terminals, since respective channel conditions may vary and forward path power control may be employed to minimize required satellite power. Additionally or alternatively, different UW symbols may be employed for different surrounding beam consistent with beam frequency reuse pattern in order to mitigate effects of co-channel interference (CCI) in UW detection and also to minimize false detection probability. In one example, UW identification to beam assignment can be fixed and can be configured during initial install of a terminal (for example, based on GPS position), however, it may be changed as it traverses to another beam. UW symbols can be used to facilitate synchronizations at a receiving terminal. Additionally, hub 1511 of FIG. 15 can insert pilot symbols in transmitted waveform signals to assist carrier phase synchronization.

Additionally, for example, for hub 1511, M-times data repetition (e.g., M=3) can be employed to ensure link closure for some terminals located in some adverse channel environments. According to certain embodiment, transmitter employed in hub 1511 can include a multiplexer (not shown) in order to multiplex all forward path waveform signals. In one example, the multiplexer (not shown) can multiplex the forward path waveform signals in time division multiplex (TDM) for transmission over the channel at a nominal symbol rate. The multiplexed waveform signals are transmitted to terminals (such as ST and/or UT 1503, 1505, 1507, and/or 1509) through the forward path.

According to one embodiment, SSCMA provides a capability to realize synchronous and asynchronous multiplexing and multiple accessing by a multiplicity of user signals over a wireline, or wireless channel (e.g., including satellite links).

FIG. 18 is a diagram of a receiver configured to operate in the systems of FIG. 15. At the receiving side, a receiver 1800 includes an antenna 1801 that receives the waveforms emitted over the communication channel. The receiver 1800 provides a de-spreader 1803 that de-spreads the received signals. Further, the receiver 1800 employs a demodulator 1805 that performs demodulation of the de-spread received signals. After demodulation, the received signals are forwarded to a channel de-scrambler 1807 to unscramble the symbols. A decoder 1809 then attempts to reconstruct the original source messages.

It is contemplated that the above transmitter 1700 and receiver 1800 can be deployed in within a single wireless terminal, in which case a common antenna system can be shared. The wireless terminal can for example be configured to operate within a satellite communication, a cellular system, wireless local area network (WLAN), etc.

According to certain embodiments, receiver 1800, which can be employed in a terminal (such as ST and/or UT 1503, 1505, 1507, and/or 1509), can include additional components and/or modules. For example, receiver 1800 can be configured to examine a packet header of the received signal to determine whether the received signal is intended for this terminal. In this exemplary embodiment, received signals can be acquired and synchronized (for example, based on UW symbols and/or pilots symbols) in time, frequency, and carrier phase for demodulation. Further, a packet header of the received signal can be decoded to extract information on packet length, FEC code rate, destination terminal address, source hub, etc. If destination address matches with the receiving terminal's address, iterative decoding (as will be discussed later) of a payload of the received signal may be employed (using, for example, signal length and code rate as identified in the header). Otherwise, the terminal may skip the signal and wait for the next received signal. Therefore, terminals will not waste their limited battery power on processing unnecessary data.

Figure 19:
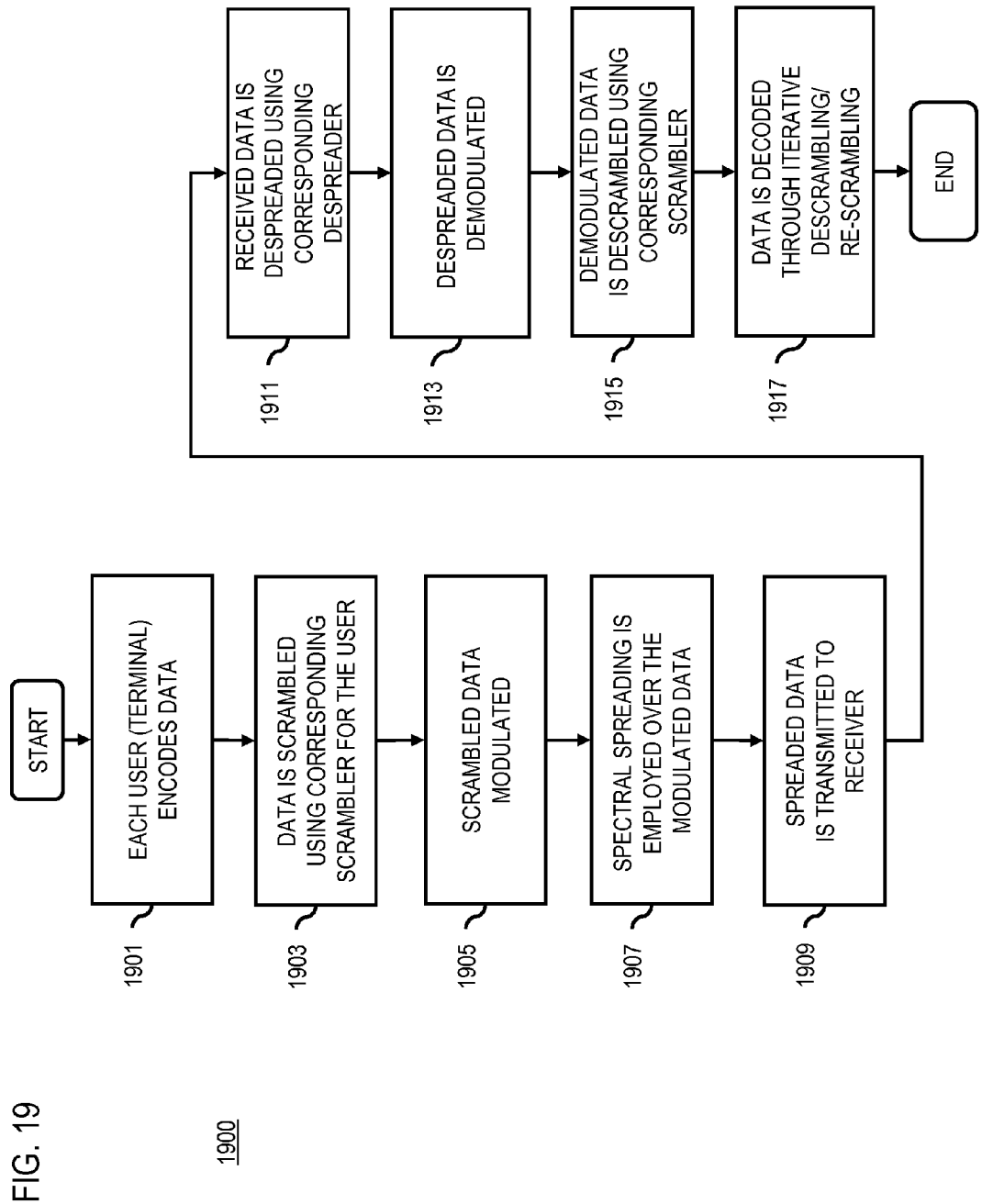
FIG. 19 is a flowchart of a process of transmission and reception using a SSCMA scheme employing low rate forward error correction (FEC) code, according to an exemplary embodiment.

FIG. 19 is a flowchart of a process of transmission and reception using a SSCMA scheme employing low rate FEC (such as LDPC, low rate turbo codes, etc.), according to an exemplary embodiment. In one embodiment, process 1900 can be employed using transmitter 1700 and receiver 1800. Additionally or alternatively, process 1900 can be performed by multiple transmitters, as explained later with respect to FIGS. 20 and 21.

In the exemplary embodiment of process 1900, each terminal (if multiple terminals are employed) encodes data using corresponding encoder (e.g., 1701 of FIG. 17), at step 1901. At step 1903, the encoded data is the scrambled using scrambler associated with the user (e.g., 1703 of FIG. 17). The scrambled data is further modulated at step 1905 and the modulated data is spread at step 1907, for example, to match the modulated signal to a given channel bandwidth. At step 1909, the spread signal is then transmitted to a receiver, such as receiver 1800.

At steps 1911 and 1913, the received signal is first de-spread and demodulated. The demodulated signal is further de-scrambled at step 1915. As will be discussed in more detail with respect to FIGS. 20 and 21, the received signal can undergo de-scrambling and re-scrambling in step 1915. The de-scrambling and re-scrambling is performed in conjunction with the decoding process, which outputs decoded data (step 1917).

Figure 20:
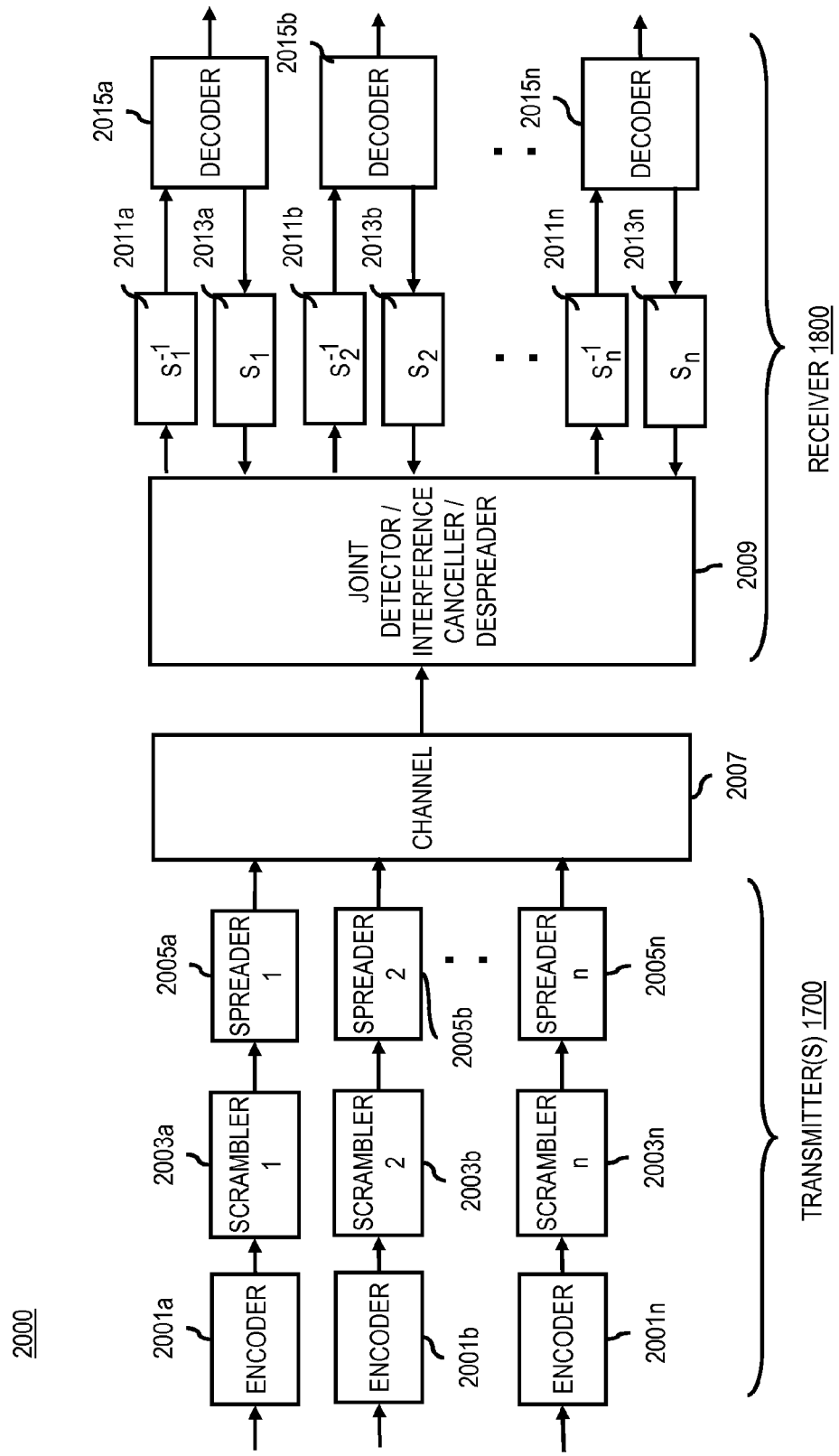
FIG. 20 is a diagram of a system capable of supporting multiple transmitters using a SSCMA scheme employing low rate FEC code, according to an exemplary embodiment.

FIG. 20 is a diagram of a system capable of supporting multiple transmitters using a SSCMA scheme employing low rate FEC, according to an exemplary embodiment. For the purposes of illustration, a communication system 2000 supports multiple terminals (i.e., users) configured with respective encoders 2001a-601n, scramblers 2003a-2003n, and spreaders 2005a-2005n. In an exemplary embodiment, these terminals can be the transmitter 1700 and the receiver 1800 of FIGS. 17 and 18, respectively, operating in the satellite system 1500 of FIG. 15, for example, employed in the return path (from terminals to the hub through satellite). In this exemplary embodiment, return path transmission may be performed by terminals (such as ST and/or UT 1503, 1505, 1507, and/or 1509) and the return path reception can be performed by hub 1511.

By way of example, the system 2000 provides a multiple access scheme, such as SSCMA, which achieves good performance with relatively lower receiver complexity compared to CDMA (as the number of users that share the same channel increases). With SSCMA, each user sharing the transmission channel is separated by user specific scramblers 2003a-2003n. Also, due to use of low rate encoding, additional coding gain can be achieved under SSCMA scheme.

By using low rate codes, the system 2000 can achieve greater power efficiency while spreading the spectrum, whereas conventional CDMA does not. Moreover, by employing low rate codes in addition with spectrum-spread techniques by the SSCMA scheme, channel capacity over a given bandwidth subject to a total aggregate power limitation also far exceeds that of a CDMA. Additionally, SSCMA is different from another multiple access technique called Interleave-Division Multiple Access (IDMA), which spreads with low-rate turbo-Hadamard codes but uses random interleavers as user signature. The turbo-Hadamard codes are not straight-forward to implement since they require the decoding of Hadamard codes in addition to the decoding of turbo-like codes. Also, all the users can utilize the same scrambler hardware with different initial vector (also known as "seed"), instead of different interleaver design. Further, using scrambling sequences as signatures is simpler than random interleaver-based signatures.

In one embodiment, encoders 2001a-2001n can include LDPC encoders. The LDPC encoded sequences are then fed to the respective user-specific scramblers 2003a-2003n. The scrambled sequences are then modulated and fed to spreaders 2005a-2005n. Spreaders 2005a-2005n may perform spectral spreading on their respective modulated waveform signals to be expanded to match a channel bandwidth (for example, of 31.25×kHz). Waveform signals output of spreaders 2005a-2005n are then transmitted over channel 2007 to a receiver, for example, receiver 1800, which includes a joint detector/interference canceller/despreader unit 2009 that interacts with the de-scramblers 2011a-2011n, scramblers 2013a-2013n, and decoders 2015a-2015n to iteratively produce an estimate of the received codewords. With each iteration, the decoder 2015a-2015n (which can include an LDPC decoder) produces a better estimate to the joint detector/interference canceller/despreader 2009 for achieving better cancellation. The information exchanged between decoders 2015a-2015n and the joint detector/interference canceller/despreader 2009 is scrambled or descrambled via scramblers 2013a-2013n or de-scramblers 2011a-2011n, respectively. Once "good" estimates of the decoded sequences are produced, they are output from the decoders 2015a-2015n.

In one exemplary embodiment, the receiver 1800, as illustrated in FIG. 20, can include a ground based beam forming (GBBF—not shown), for example, before joint detector/interference canceller/despreader 2009 for processing by beams and by channels. The desired output of the desired channel (for example, 31.25×kHz channel) can be further processed, as noted above. According to certain embodiments, joint detector/interference canceller/despreader 2009 can, for each terminal, perform UW detection, chip timing recovery, de-spreading, carrier phase synchronization (for example, in presence of frequency error and multipath fades), etc.

Unlike conventional CDMA systems, joint detector/interference canceller/despreader 2009 does not require all the signals accessing the same spectrum at the same time to be of equal power. In fact, the performance is better when the signals are of different power level. Thus, no tight power controls are needed. Also due to joint-detection/interference cancellation, the system 2000 provides a scheme that is much more robust against Rician fading, which makes it particularly more attractive for small mobile terminals experiencing Rician multipath fading.

Therefore, the system 2000, as a SSCMA system using low-rate FEC coding, requires less power to transmit data at the same speed vis-à-vis a CDMA system. In one embodiment, the system 2000 can be operated in a random access manner and does not require reservation of time slots, which minimize delay to one satellite round trip. Additionally, the system 2000, as mentioned, does not require tight power control, and thus, minimize the coordination needed between transmitter 1700 and receiver 1800. By way of example, potential applications can be for mobile or aeronautical terminals. It may also have applications to enable direct broadcast satellite (DBS) operators to provide return link over satellite via a commercial satellite using existing antenna systems.

Each terminal (or user) can encode its data with, for example, a rate 1/n FEC, where n is an integer larger than 3. The coded bits are then scrambled with a unique scrambling sequence, modulated, spread, and transmitted. Number of unique sequences is virtually unlimited with common sequence generators, such as the Gold sequences. The same generator can generate all the sequences, which are differentiated by the initial vector. It is noted that other low rates can be utilized, m/n (e.g., less than ⅓). In an exemplary embodiment, the scrambling sequence can be generated by selecting a pseudorandom number sequence (e.g., Gold sequence) whose period is greater than the code block. On the receiver side, the respective terminal uses the corresponding demodulator, despreader, de-scrambler, and a rate 1/n decoder to retrieve its data. The signals are modulated by the same type of modulation of the same bandwidth, centered at the same frequency and transmitted at the same time (e.g., similar to CDMA). Typically, for receivers located in a hub of a star-shaped network, the antennas can be shared.

Figure 21A:
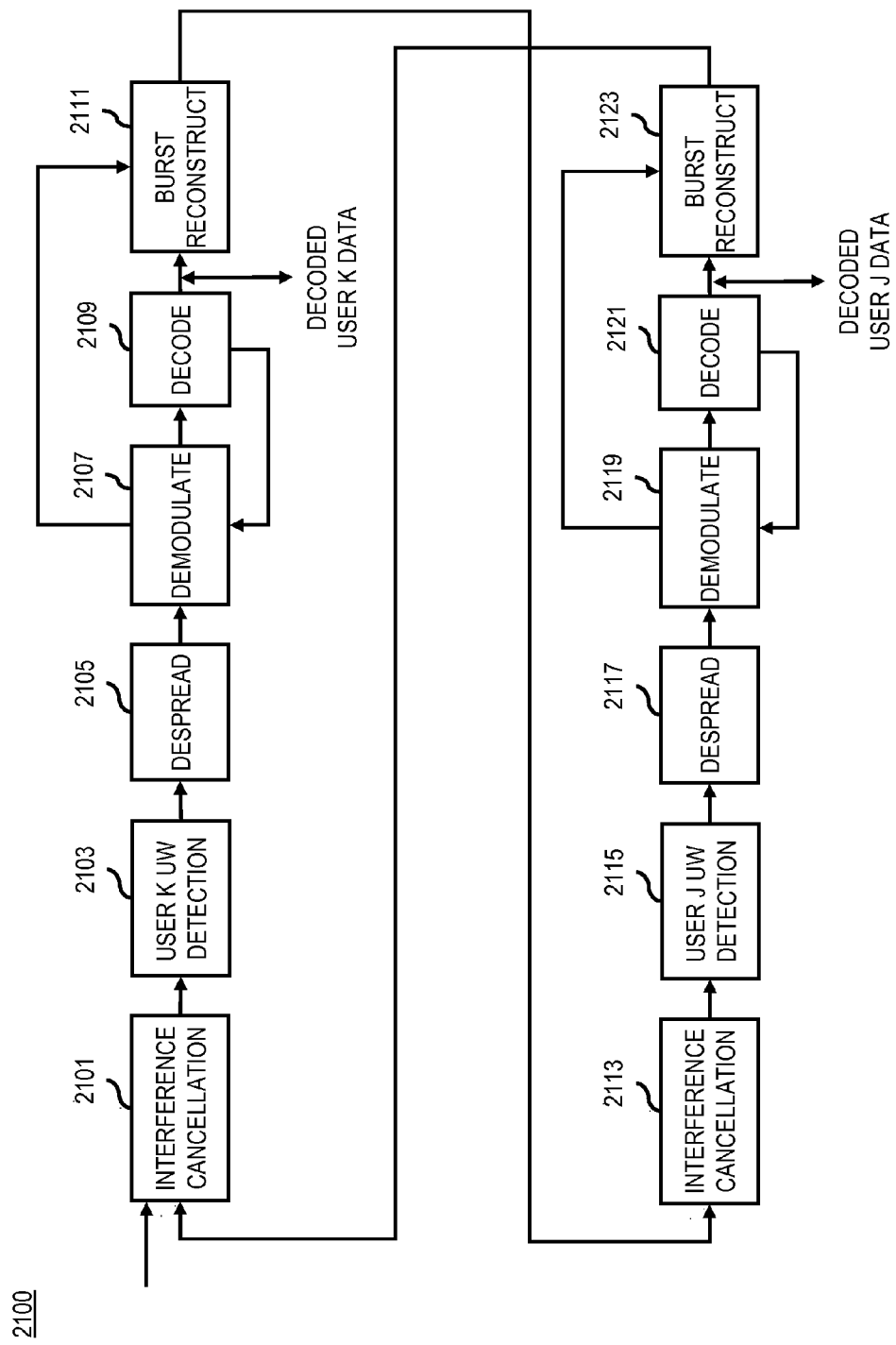
FIGS. 21A and 21B are, respectively, a functional diagram and a flowchart for joint detection/interference cancellation in the system of FIG. 20, according to an exemplary embodiment.
Figure 21B:
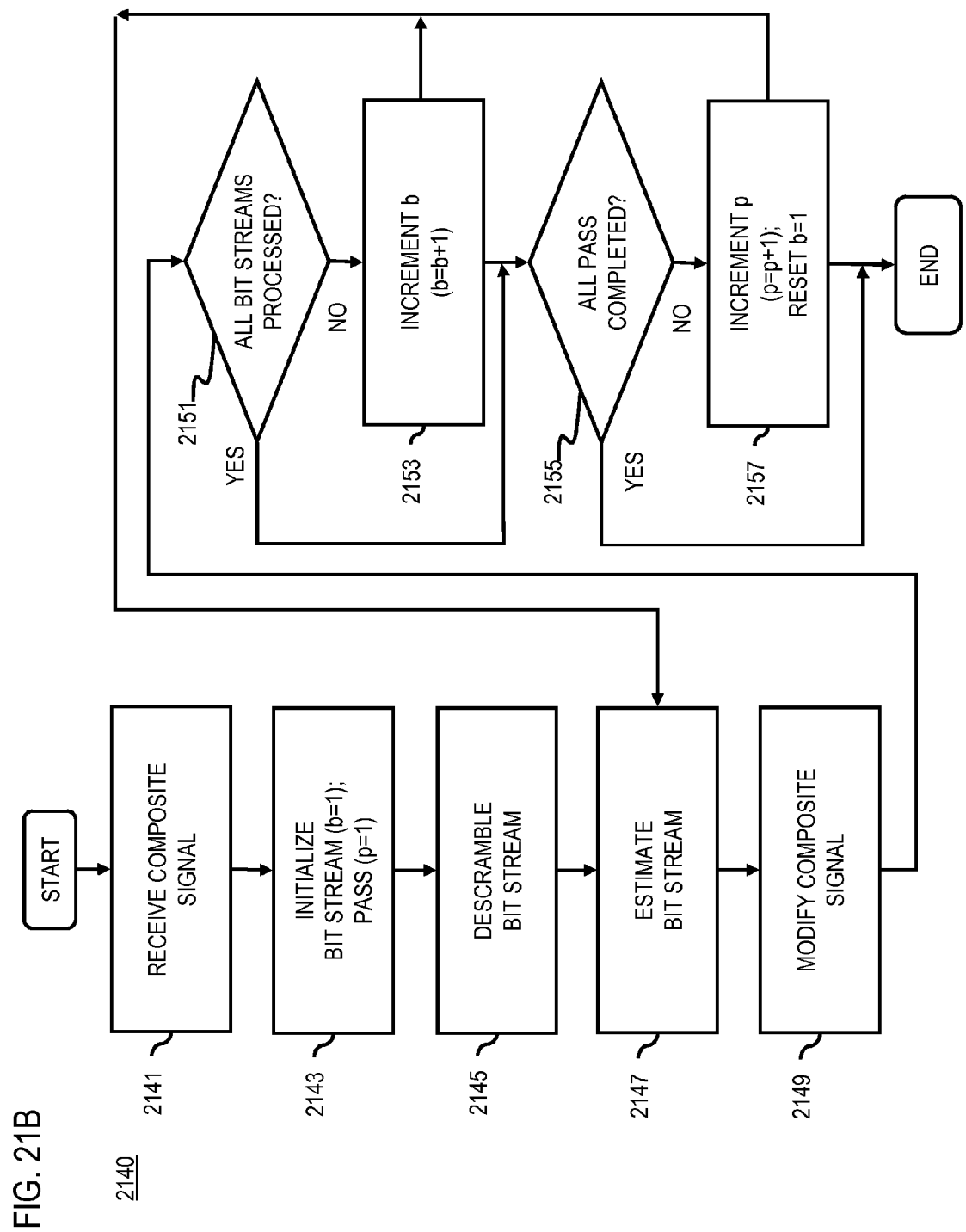

FIGS. 21A and 21B are, respectively, a functional diagram and a flowchart for joint detection/interference cancellation in the system of FIG. 20, according to an exemplary embodiment. A key enabler for this communication system 2000 is the joint-detection/interference cancellation receiver. This receiver 1800 includes the descramblers 2011a-2011n and the decoders 2015a-2015n as well as all the signal estimators and interference reducers for each of the individual signal paths. In addition, the receiver 1800 includes a buffer (not shown) to store a complete block of the composite signal. The receiver 1800 employs joint detection/estimation; it is contemplated that any joint-detection/estimation technique may be used. In an exemplary embodiment, the receiver 1800 operates iteratively to output the bit streams represented by the composite signal.

In one exemplary embodiment, the iterative functional diagram 2100 receives the composite signal and cancels interferences at block 2101. In one example, known interfering signals (e.g., bursts) are cancelled from the composite signal except the user signal of interest. In the exemplary embodiment of FIG. 21A, signal associated to user J may be cancelled from the composite signal at block 2101. A cleaned up composite signal, for example without user J's signal, undergoes UW detection, at block 2103. In one exemplary embodiment, the UW detection can be performed for a specific user (such as user K as illustrated). Additionally or alternatively, UW detection can include a correlation process to detect a strongest UW symbol in presence of user link Doppler, residual frequency errors, multipath fading, etc. Upon UW detection at block 2103, chip timing recovery, de-spreading, carrier phase synchronization, demodulation, and decoding of the desired signal may be performed at steps 2105-2109. In one exemplary embodiment, decoding can include any iterative decoding to the demodulated signal. For example, the decoding can include the LDPC decoding as discussed before, for instance in accordance with FIGS. 10-14.

Next, at block 2111, the decoded data is employed to re-encode, re-insert UW and pilot symbols, re-modulate, and re-spread to create a "cleaned-up" copy of the desired user signal. In the exemplary embodiment of FIG. 21A, the "cleaned up" copy of signal associated with user K can be input for interference cancellation block 2113 for a similar process performed at steps 2115-2123 to create a "cleaned up" signal associated with user J. According to certain embodiments, the iterative process 2100 can continue to create "cleaner" version of decoded data for each user. In one example, higher iteration of detection/estimation process can be carried out without UW detection but including minor timing adjustment signal timing estimate based on the finer symbol timing estimates. Such iterative process of 2100 can repeat until all user signals are processed. In one exemplary embodiment, after all user signals are processed, decoders, at blocks 2109 and 2121, output the decoded data, such as decoded user K data and decoded user J data.

As noted, SSCMA algorithm is not sensitive to large disparity of user signal strength, unlike the conventional CDMA signal reception where large disparity of signal can result in strong self interference and induce undesirable near-far problem. In contrast, large signal disparity can improve the SSCMA detection performance due to the fact that stronger signal can result in better initial signal detection thereby yielding better interference cancellation. Therefore, unlike CDMA, no return path power control is required.

FIG. 21B illustrates a flowchart for joint detection/interference cancellation in the system of FIG. 20, according to another exemplary embodiment. As seen in FIG. 21B, in steps 2141-2147, once an entire block of composite waveform is de-spread, demodulated, sampled, and stored in the buffer, the receiver 1800 first uses the first descrambler (e.g., descrambler 2011a) and a decoder (e.g., decoder 2015a) to estimate the first bit-stream. In one example, decoders 2015a-2015n can include LDPC decoders, as discussed above. In step 2149, the composite signal is modified accordingly. In this example, only one pass of the decoding is performed. The interference reducer then operates on the stored waveform given the result of the first pass decoding of the first signal. The receiver 1800 then uses the second descrambler (e.g., descrambler 2011b) and decoder (e.g., decoder 2015b) to estimate the second bit-stream, and so on. When all the bit-streams have been estimated once (as determined in step 2151), the receiver 1800 than returns to process the first bit-stream in a second pass.

When all the bit-streams have been processed for the required number passes (steps 2153-2157), all the bit-streams are completely estimated and decoded.

Alternatively, in another embodiment, all the paths can be processed in-parallel for each pass; this approach may entail more passes than the above process.

Signal estimation, via a demodulator (not shown), plays an important role. In most applications of interest, this demodulator must operate at very low signal-to-noise plus interference ratio. In one embodiment, the demodulator is aided by two features: synchronization, and joint detection. The initial synchronization involves use of a known pilot, which can be introduced using anyone of the techniques known in the art. For example, known pilot symbols can be introduced by multiplexing them into the data stream, or pilot symbols may be introduced by puncturing the encoder output. Just as each scrambler 2003a-2003n employs a different scrambling signature, each may employ a different pilot symbol pattern, thereby minimizing interference effects.

With respect to joint detection, this process involves iterative refinement of the demodulation. As the iteration progresses, the demodulation is improved through two techniques. First, as interference is removed, the estimation of signal parameters (e.g., frequency, symbol timing, carrier phase) is improved. Secondly, as more reliable estimates of the data symbols become available from the decoders 2015a-2015n, these are used to improve the demodulator performance.

In one embodiment, the signals are transmitted in a burst mode. Accordingly, the demodulator is configured to detect the burst arrival times by using, for example, a "Unique Word" pattern and/or symbol. It is recognized that any other well-known techniques may be used for this purpose. The Unique Word patterns of the various encoders may or may not be distinct.

FIGS. 22A and 22B illustrate, respectively, burst format for return path transmission and forward path transmission, according to various exemplary embodiments. In one exemplary embodiment, the signals transmitted form terminals (such as ST and/or UT 1503, 1505, 1507, and/or 1509) to hub 1511 in the return path can be in a burst mode with the format illustrated in FIG. 22A. The burst 2200 can include a unique word pattern UW 2201. UW 2201 can assist timing synchronization and unique UW can be used to distinguish a terminal burst transmission. Further, burst 2200 can include a packet heater 2203. As illustrated in FIG. 22A, packet header 2203 can include terminal identification (UT ID) 2211, packet length ID 2213, repetition indicator 2215, message number (Msg. No.) 2217, and packet number (Pkt. No.) 2219.

In one exemplary embodiment, additional electronic serial number (ESN—in addition to UW and scrambler) may be included for as terminal identification 2211 across satellite coverage. The nominal packet length 2213 and data repetition indicator 2215 can be configured at initial install of a terminal and/or be changed upon a command (for example, from hub 1511), which is available for duplex terminals. In one exemplary embodiment, packet length 2213 can demonstrate length of the packet or burst. Additionally, message number 2217 and packet number 2219 can be employed to indicate a message and an associated packet number within that message for hub 1511 to differentiate within a given period of time, assuming all packet reception can be logged by the time of reception at hub 1511.

Further, burst 2200 can include payload 2205, which can contain information (such as sensor data) that the terminal intends to transmit. In one exemplary embodiment, payload 2205 can include encoded and/or scrambled data. Burst 2200 can also include pilot symbol 2207. In one exemplary embodiment, pilot symbols 2207 are distributed evenly between payloads 2205 and can ensure burst synchronization at low energy per chip over noise density (Ec/No). Also burst 2200 can include a cyclic redundancy check (CRC) 2209. CRC 2209 can include an error detecting code to detect and/or correct accidental changes that might have occurred in burst 2200, for example, during transmission. It is noted that any commonly used and standardized CRC can be used. Also, it is contemplated that any other error detecting codes and functions can be employed.

Further, according to one exemplary embodiment, for a terminal with receiving capability, a quality of service indicator of forward path as measured at the terminal can be incorporated in the return path payload to facilitate forward path power control at hub 1511. Also, terminals can use their measured quality of service to adjust their uplink power for return path transmission unless hub 1511 commands them to reduce their power.

FIG. 22B illustrates burst format for forward path transmission, according to an exemplary embodiment. In this exemplary embodiment, the signals transmitted form, for example, hub 1511 to terminals (such as ST and/or UT 1503, 1505, 1507, and/or 1509) on a forward path (for example through the satellite 1501) can be in a burst mode with the format illustrated in FIG. 22B. Burst 2230 can include a unique word (UW) symbol 2231 and a packet header 2233. For illustration purposes, packet header 2233 can include destination address 2241, packet length ID 2243, hub ID 2245, and header parity check 2247.

According to certain embodiments, destination address 2241 can include a user terminal address for which burst 2230 is transmitted. In one example, destination address 2231 can include an electronic serial number (ESN) for identification. Packet length 2243 and hub ID 2245 can determine nominal length of burst 2230 and identification (such as address) of the hub that is transmitting burst 2230. Packet length 2243 can be used to enable adequate iterative decoding. According to one exemplary embodiment, destination address 2241, packet length 2243, and hub ID 2245 can be protected by a separate error correcting code such as header parity check 2247. Although header parity check 2247 is illustrated in FIG. 22B, it is contemplated that other error correcting codes such as forward error correcting codes can be employed. Using header error correcting code such as header parity check 2247 prevents terminals from wasting their battery power on iterative decoding of bursts that are not destined to them.

Burst 2230 can further include payload 2235, pilot symbols 2237 (that can be evenly distributed between payloads), and a CRC 2239.

Figure 23:
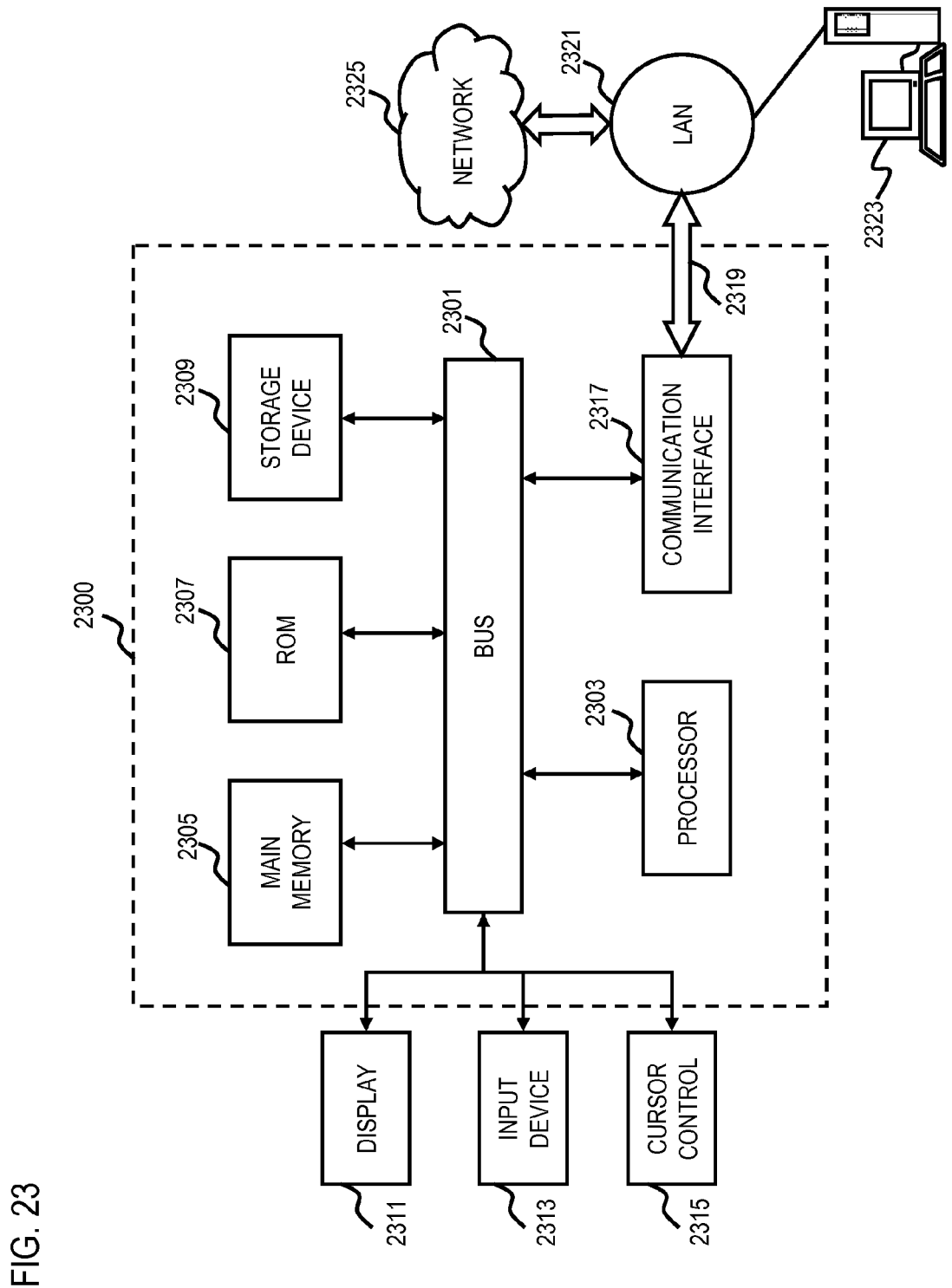
FIG. 23 is a diagram of a computer system that can perform the processes of encoding and decoding of LDPC codes, in accordance with various exemplary embodiments.

FIG. 23 illustrates a computer system upon which an embodiment according to the present invention can be implemented. The computer system 2300 includes a bus 2301 or other communication mechanism for communicating information, and a processor 2303 coupled to the bus 2301 for processing information. The computer system 2300 also includes main memory 2305, such as a random access memory (RAM) or other dynamic storage device, coupled to the bus 2301 for storing information and instructions to be executed by the processor 2303. Main memory 2305 can also be used for storing temporary variables or other intermediate information during execution of instructions to be executed by the processor 2303. The computer system 2300 further includes a read only memory (ROM) 2307 or other static storage device coupled to the bus 2301 for storing static information and instructions for the processor 2303. A storage device 2309, such as a magnetic disk or optical disk, is additionally coupled to the bus 2301 for storing information and instructions.

The computer system 2300 may be coupled via the bus 2301 to a display 2311, such as a cathode ray tube (CRT), liquid crystal display, active matrix display, or plasma display, for displaying information to a computer user. An input device 2313, such as a keyboard including alphanumeric and other keys, is coupled to the bus 2301 for communicating information and command selections to the processor 2303. Another type of user input device is cursor control 2315, such as a mouse, a trackball, or cursor direction keys for communicating direction information and command selections to the processor 2303 and for controlling cursor movement on the display 2311.

According to one embodiment of the invention, generation of LDPC codes is provided by the computer system 2300 in response to the processor 2303 executing an arrangement of instructions contained in main memory 2305. Such instructions can be read into main memory 2305 from another computer-readable medium, such as the storage device 2309.

Execution of the arrangement of instructions contained in main memory 2305 causes the processor 2303 to perform the process steps described herein. One or more processors in a multi-processing arrangement may also be employed to execute the instructions contained in main memory 2305. In alternative embodiments, hard-wired circuitry may be used in place of or in combination with software instructions to implement the embodiment of the present invention. Thus, embodiments of the present invention are not limited to any specific combination of hardware circuitry and software.

The computer system 2300 also includes a communication interface 2317 coupled to bus 2301. The communication interface 2317 provides a two-way data communication coupling to a network link 2319 connected to a local network 2321. For example, the communication interface 2317 may be a digital subscriber line (DSL) card or modem, an integrated services digital network (ISDN) card, a cable modem, or a telephone modem to provide a data communication connection to a corresponding type of telephone line. As another example, communication interface 2317 may be a local area network (LAN) card (e.g. for Ethernet™ or an Asynchronous Transfer Model (ATM) network) to provide a data communication connection to a compatible LAN. Wireless links can also be implemented. In any such implementation, communication interface 2317 sends and receives electrical, electromagnetic, or optical signals that carry digital data streams representing various types of information. Further, the communication interface 2317 can include peripheral interface devices, such as a Universal Serial Bus (USB) interface, a PCMCIA (Personal Computer Memory Card International Association) interface, etc.

The network link 2319 typically provides data communication through one or more networks to other data devices. For example, the network link 2319 may provide a connection through local network 2321 to a host computer 2323, which has connectivity to a network 2325 (e.g. a wide area network (WAN) or the global packet data communication network now commonly referred to as the "Internet") or to data equipment operated by service provider. The local network 2321 and network 2325 both use electrical, electromagnetic, or optical signals to convey information and instructions. The signals through the various networks and the signals on network link 2319 and through communication interface 2317, which communicate digital data with computer system 2300, are exemplary forms of carrier waves bearing the information and instructions.

The computer system 2300 can send messages and receive data, including program code, through the network(s), network link 2319, and communication interface 2317. In the Internet example, a server (not shown) might transmit requested code belonging to an application program for implementing an embodiment of the present invention through the network 2325, local network 2321 and communication interface 2317. The processor 2303 may execute the transmitted code while being received and/or store the code in storage device 239, or other non-volatile storage for later execution. In this manner, computer system 2300 may obtain application code in the form of a carrier wave.

The term "computer-readable medium" as used herein refers to any medium that participates in providing instructions to the processor 2303 for execution. Such a medium may take many forms, including but not limited to non-volatile media, volatile media, and transmission media. Non-volatile media include, for example, optical or magnetic disks, such as storage device 2309. Volatile media include dynamic memory, such as main memory 2305. Transmission media include coaxial cables, copper wire and fiber optics, including the wires that comprise bus 2301. Transmission media can also take the form of acoustic, optical, or electromagnetic waves, such as those generated during radio frequency (RF) and infrared (IR) data communications. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, and EPROM, a FLASH-EPROM, any other memory chip or cartridge, a carrier wave, or any other medium from which a computer can read.

Various forms of computer-readable media may be involved in providing instructions to a processor for execution. For example, the instructions for carrying out at least part of the present invention may initially be borne on a magnetic disk of a remote computer. In such a scenario, the remote computer loads the instructions into main memory and sends the instructions over a telephone line using a modem. A modem of a local computer system receives the data on the telephone line and uses an infrared transmitter to convert the data to an infrared signal and transmit the infrared signal to a portable computing device, such as a personal digital assistance (PDA) and a laptop. An infrared detector on the portable computing device receives the information and instructions borne by the infrared signal and places the data on a bus. The bus conveys the data to main memory, from which a processor retrieves and executes the instructions. The instructions received by main memory may optionally be stored on storage device either before or after execution by processor.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

What is claimed is:

1. A method comprising:
  encoding, by a processor of a first device, one or more blocks of information bits of a first source bit stream based on a predetermined structured parity check matrix of an LDPC code to generate a first LDPC encoded bit stream, wherein the parity check matrix is represented by stored information configured in a tabular format of rows and columns, wherein each row represents occurrences of one values within a respective column of the parity check matrix;
  scrambling the first LDPC encoded bit stream according to a scrambling signature based on a first initial vector, wherein the scrambling of the first LDPC encoded bit stream is configured for distinguishing the first LDPC encoded bit stream of the first device from a second scrambled bit stream of a second device to facilitate a multiple access scheme;
  wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, ..., $n_{ldpc}-k_{ldpc}-1$), comprises:
    initializing parity bit accumulators $a_0 = a_1 = \ldots = a_{n_{ldpc}-k_{ldpc}-1} = 0$;
    for a one of the blocks of information bits, divided into j sequential groups (each of a size of M information bits), and for j=1, 2, 3, ... $k_{ldpc}$/M: (1) accumulating a first information bit of a $j^{th}$ group in certain of the parity bit accumulators reflected by accumulator addresses based on a $j^{th}$ row of the stored tabular information; and (2) accumulating the remaining (M−1) information bits of the $j^{th}$ group in certain of the parity bit accumulators reflected by accumulator addresses according to {x+m mod M*q} mod ($n_{ldpc}$−$k_{ldpc}$), wherein x denotes an address of the parity bit accumulator corresponding to the first bit of the group, and q=($n_{ldpc}$−$k_{ldpc}$)/M; and after all of the information bits of the one block are accumulated, sequentially performing operations (with respect to the parity bit accumulators) according to $a_i$=$a_i$⊕$a_{i-1}$, i=1, 2, ... ($n_{ldpc}$−$k_{ldpc}$−1), where the additions are in Galois Field (GF) 2; and wherein the parity bits $p_i$, i=0, 1, ... ($n_{ldpc}$−$k_{ldpc}$−1) are respectively reflected by the resulting parity bit accumulators $a_i$, i=0, 1, ... ($n_{ldpc}$−$k_{ldpc}$−1).

2. A method according to claim 1, wherein the scrambling signature comprises Gold sequences.

3. A method according to claim 1, wherein the stored information representing the structured parity check matrix comprises a one of the following Tables respectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |
| Address of Parity Bit Accumulators (Rate 1/15) |
| 4788 4536 |
| 2849 2282 |
| 1750 2947 |
| 1197 4151. |

4. A method according to claim 1, wherein M=50 and q=64 for a rate 1/9 LDPC code, and M=100 and q=56 for a rate 1/15 LDPC code.

5. A method according to claim 4, wherein the stored information representing the structured parity check matrix comprises a one of the following Tables resnectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |
| Address of Parity Bit Accumulators (Rate 1/15) |
| 4788 4536 |
| 2849 2282 |
| 1750 2947 |
| 1197 4151. |

6. A method according to claim 3, wherein row indices of 1's in a column index j*M (j=0, 1, 2, 3, ..., $k_{ldpc}$/M−1) of the parity check matrix are provided at the $j^{th}$ row according to the one Table.

7. A method according to claim 1, wherein the LDPC code is of a structure that facilitates use of a plurality of parallel engines for decoding the encoded bot stream.

8. A method according to claim 1, further comprising:
modulating the LDPC encoded bit stream according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

9. An apparatus, comprising:
at least one processor; and
at least one memory including computer program code for one or more programs,
the at least one memory and the computer program code configured to, with the at least one processor, cause the apparatus to perform at least the following:
encoding one or more blocks of information bits of a first source bit stream based on a predetermined structured parity check matrix of an LDPC code to generate a first LDPC encoded bit stream, wherein the parity check matrix is represented by stored information configured in a tabular format of rows and columns, wherein each row represents occurrences of one values within a respective column of the parity check matrix;
scrambling the first LDPC encoded bit stream according to a scrambling signature based on a first initial vector, wherein the scrambling of the first LDPC encoded bit stream is configured for distinguishing the first LDPC encoded bit stream of the apparatus from a scrambled second bit stream of a second apparatus to facilitate a multiple access scheme;
wherein the LDPC encoding of the blocks of information bits (each block being of a size of $k_{ldpc}$ information bits, and each resulting encoded block being of a size of $n_{ldpc}$ code bits including parity bits $p_i$, i=0, 1, 2, ..., $n_{ldpc}$−$k_{ldpc}$−1), comprises:
initializing parity bit accumulators $a_0$=$a_1$=...=$a_{n_{ldpc}-k_{ldpc}-1}$=0;
for a one of the blocks of information bits, divided into j sequential groups (each of a size of M information bits), and for j=1, 2, 3, ... $k_{ldpc}$/M: (1) accumulating a first information bit of a $j^{th}$ group in certain of the parity bit accumulators reflected by accumulator addresses based on a $j^{th}$ row of the stored tabular information; and (2) accumulating the remaining (M−1) information bits of the $j^{th}$ group in certain of the parity bit accumulators reflected by accumulator addresses according to {x+m mod M*q} mod($n_{ldpc}$−$k_{ldpc}$), wherein x denotes an address of the parity bit accumulator corresponding to the first bit of the group, and q=($n_{ldpc}$−$k_{ldpc}$)/M; and after all of the information bits of the one block are accumulated, sequentially performing operations (with respect to the parity bit accumulators) according to $a_i$=$a_i$⊕$a_{i-1}$, i=1, 2, ... ($n_{ldpc}$−$k_{ldpc}$−1), where the additions are in Galois Field (GF) 2; and wherein the parity bits $p_i$, i=0, 1, ... ($n_{ldpc}$-$k_{ldpc}$-1) are respectively reflected by the resulting parity bit accumulators $a_i$, i=0, 1, ... ($n_{ldpc}$-$k_{ldpc}$-1).

10. An apparatus according to claim 9, wherein the scrambling signature comprises Gold sequences.

11. An apparatus according to claim 9, wherein the stored information representing the structured parity check matrix comprises a one of the following Tables respectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |

| Address of Parity Bit Accumulators (Rate 1/15) |
| --- |
| 4788 4536 |
| 2849 2282 |
| 1750 2947 |
| 1197 4151. |

12. An apparatus according to claim 9, wherein M=50 and q=64 for a rate 1/9 LDPC code, and M=100 and q=56 for a rate 1/15 LDPC code.

13. An apparatus according to claim 12, wherein the stored information representing the structured parity check matrix comprises a one of the following Tables respectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |

| Address of Parity Bit Accumulators (Rate 1/15) |
| --- |
| 4788 4536 |
| 2849 2282 |
| 1750 2947 |
| 1197 4151. |

14. An apparatus according to claim 11, wherein row indices of 1's in a column index j*M (j=0, 1, 2, 3, ..., $k_{ldpc}$/M-1) of the parity check matrix are provided at the $j^{th}$ row according to the one Table.

15. An apparatus according to claim 9, wherein the LDPC code is of a structure that facilitates use of a plurality of parallel engines for decoding the encoded bit stream.

16. An apparatus according to claim 9, further comprising: modulating the LDPC encoded bit stream according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

17. A system comprising:
a first terminal device comprising a first encoder configured to encode one or more blocks of information bits of a first source bit stream based on a first predetermined structured parity check matrix of a first LDPC code to generate a first LDPC encoded bit stream, wherein the first parity check matrix is represented by stored information configured in a tabular format of rows and columns, wherein each row represents occurrences of one values within a respective column of the parity check matrix, and a first scrambling module configured to scramble the first LDPC encoded bit stream according to a first scrambling signature based on a first initial vector; and a second terminal device comprising a second encoder configured to encode one or more blocks of information bits of a second source bit stream based on a second predetermined structured parity check matrix of a second LDPC code to generate a second LDPC encoded bit stream, wherein the second parity check matrix is represented by stored information configured in a tabular format of rows and columns, wherein each row represents occurrences of one values within a respective column of the parity check matrix; and a second scrambling module configured to scramble the second LDPC encoded bit stream according to a second scrambling signature based on a second initial vector;

wherein the scrambling of the first and second LDPC encoded bit streams is configured for distinguishing the first LDPC encoded bit stream of the first terminal device from the second LDPC encoded bit stream of the second terminal device to facilitate a multiple access scheme; and wherein the respective LDPC encoding of the respective blocks (each block being of a size of $k_{ldpc}$ information bits, and each resulting encoded block being of a size of $n_{ldpc}$ code bits including parity bits $p_i$, i=0, 1, 2, ..., $n_{lcpc}$-$k_{ldpc}$-1) of information bits of each of the first and second bit streams, comprises:

initializing parity bit accumulators $a_0=a_1=\ldots=a_{n_{ldpc}k_{ldpc}-1}=0$;

for a one of the blocks of information bits, divided into j sequential groups (each of a size of M information bits), and for j=1, 2, 3, ... $k_{ldpc}$/M: (1) accumulating a first information bit of a $j^{th}$ group in certain of the parity bit accumulators reflected by accumulator addresses based on a $j^{th}$ row of the stored tabular information; and (2) accumulating the remaining (M-1) information bits of the $j^{th}$ group in certain of the parity bit accumulators reflected by accumulator addresses according to {x+m mod M*q} mod ($n_{ldpc}$-$k_{ldpc}$), wherein x denotes an address of the parity bit accumulator corresponding to the first bit of the group, and q=($n_{ldpc}$-$k_{ldpc}$)/M; and after all of the information bits of the one block are accumulated, sequentially performing operations (with respect to the parity bit accumulators) according to $a_i=a_i \oplus a_{i-1}$, i=1, 2, ... ($n_{ldpc}$-$k_{ldpc}$-1), where the additions are in Galois Field (GF) 2; and wherein the parity bits $p_i$, i=0, 1, ... ($n_{ldpc}$-$k_{ldpc}$-1) are respectively reflected by the resulting parity bit accumulators $a_i$, i=0, 1, ... ($n_{ldpc}$-$k_{ldpc}$-1).

18. A system to claim 17, wherein one or more of the first and second scrambling signatures each comprises Gold sequences.

19. A system according to claim 17, wherein one or more of the stored information representing the structured parity check matrix of the first LDPC code and the stored information representing the structured parity check matrix of the second LDPC code each comprises a one of the following Tables respectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |
| Address of Parity Bit Accumulators (Rate 1/15) |
| 4788 4536 |
| 2849 2282 |
| 1750 2947 |
| 1197 4151. |

20. A system according to claim 17, wherein M=50 and q=64 for a rate 1/9 LDPC code, and M=100 and q=56 for a rate 1/15 LDPC code.

21. A system according to claim 20, one or more of the stored information representing the structured parity check matrix of the first LDPC code and the stored information representing the structured parity check matrix of the second LDPC code each comprises a one of the following Tables respectively for a rate 1/9 code and a rate 1/15 code:

| Address of Parity Bit Accumulators (Rate 1/9) |
| --- |
| 1380 2744 |
| 332 2984 |
| 2784 2624 |
| 92 596 |
| 180 1160 |
| 464 1624 |
| 2556 1580 |
| 708 1008 |
| Address of Parity Bit Accumulators (Rate 1/15) |
| 4788 4536 |
| 2849 2282 |
| 1750 2947 |
| 1197 4151. |

22. A system according to claim 19, wherein row indices of 1's in a column index j*M (j=0, 1, 2, 3, ..., $k_{ldpc}$/M−1) of one or more of the parity check matrix of the first LDPC code and the parity check matrix of the second LDPC code is each provided at the $j^{th}$ row according to the one Table.

23. A system according to claim 17, wherein the LDPC codes are of a structure that facilitates use of a plurality of parallel engines for decoding the encoded bit streams.

24. A system according to claim 17, further comprising:
modulating the LDPC encoded bit stream according to a signal constellation reflecting one of QPSK (Quadrature Phase Shift Keying), OQPSK (Offset QPSK), PSK (Phase Shift Keying), 8-PSK, 16-APSK (Amplitude PSK), and 32-APSK.

25. A system according to claim 17, wherein the first scrambling signature relatively matches the second scrambling signature, and the first and second initial vectors differ in order to facilitate the distinguishing between the first LDPC encoded bit stream of the first terminal device from the second LDPC encoded bit stream of the second terminal device.

26. A system according to claim 17, wherein the first and second scrambling signatures differ in order to facilitate the distinguishing between the first LDPC encoded bit stream of the first terminal device from the second LDPC encoded bit stream of the second terminal device.

* * * * *